United States Patent
Azuma et al.

(10) Patent No.: US 7,313,005 B2
(45) Date of Patent: Dec. 25, 2007

(54) PWM CIRCUIT CONTROL METHOD

(75) Inventors: Katsuji Azuma, Osaka (JP); Daishi Gouko, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 236 days.

(21) Appl. No.: 11/159,155

(22) Filed: Jun. 23, 2005

(65) Prior Publication Data

US 2005/0285582 A1 Dec. 29, 2005

(30) Foreign Application Priority Data

Jun. 24, 2004 (JP) ............................ P2004-186216

(51) Int. Cl.
*H02M 1/12* (2006.01)

(52) U.S. Cl. .................. 363/41; 318/599; 318/801; 318/811; 323/282; 323/285; 327/175; 363/21.1; 363/21.11; 363/21.18; 363/26

(58) Field of Classification Search ........ 323/282–285, 323/286, 287, 288; 363/41; 327/175; 318/599, 318/801, 811
See application file for complete search history.

(56) References Cited

U.S. PATENT DOCUMENTS

| 4,095,165 | A | * | 6/1978 | Boros | 323/283 |
| 5,499,177 | A | * | 3/1996 | Ichihara | 363/37 |
| 6,600,295 | B2 | * | 7/2003 | Kanekawa et al. | 323/222 |
| 2003/0231010 | A1 | * | 12/2003 | Sase et al. | 323/282 |
| 2004/0196018 | A1 | * | 10/2004 | Sutardja et al. | 323/283 |
| 2004/0217748 | A1 | * | 11/2004 | Andrews | 323/288 |

FOREIGN PATENT DOCUMENTS

JP 10-112982 4/1998

* cited by examiner

*Primary Examiner*—Bao Q. Vu
*Assistant Examiner*—Stuart Hansen
(74) *Attorney, Agent, or Firm*—McDermott Will & Emery LLP

(57) ABSTRACT

In the PWM circuit of the present invention, a PWM counter counts clock signals. A reference value setting register sets a comparative reference value for determining a duty ratio of a PWM signal. A comparator generates the PWM signals based on a comparative result of the comparative reference value and a count value of the PWM counter. A delay device delays the PWM signal. A switching device switchably outputs the output of the comparator and the output of the delay device in order of time sequence. Thereby, the pulse phase of the PWM signal can be adjusted.

3 Claims, 28 Drawing Sheets

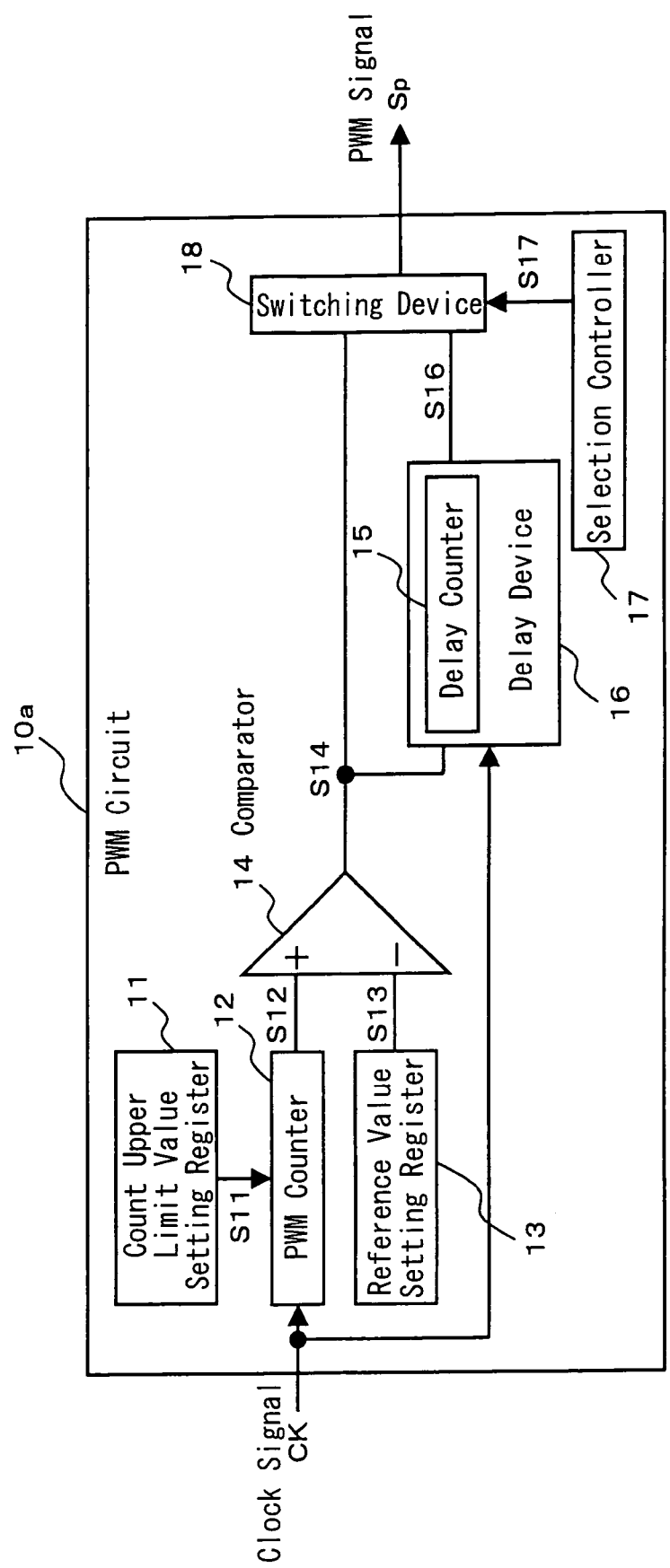
F I G. 1

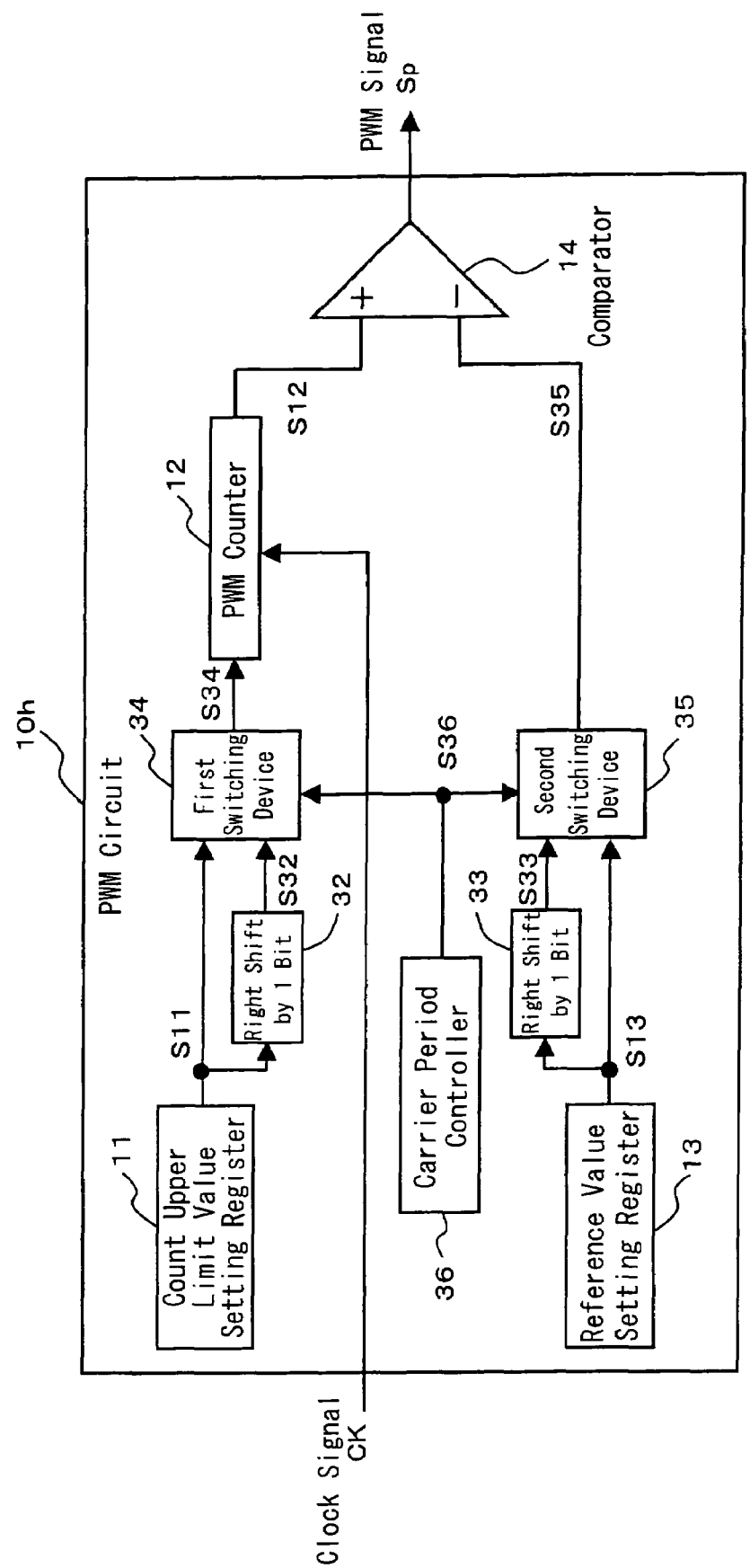
F I G . 2 1

PWM CIRCUIT CONTROL METHOD

BACKGROUND OF THE INVENTION

1. Field of the Invention

The present invention relates to a PWM circuit and a PWM circuit control method for generating a pulse width modulation (PWM) signal used for performing inverter-control and the like on a motor.

2. Description of the Related Art

In general, a PWM circuit comprises: a count upper limit value setting register for setting the count upper limit value for determining a carrier period of PWM; a PWM counter for performing up/down count of clock signals; a reference value setting register for setting a comparative reference value which determines the duty ratio of the PWM signal; and a comparator which compares the count value of the PWM counter and the comparative reference value of the reference value setting register, and generates an active PWM signal when the former value exceeds the latter value. Japanese Patent Unexamined Publication No. 10-112982 discloses an example of such PWM circuit.

However, the effective pulse period of the PWM signal becomes a waveform which is symmetrical with respect to the center of the carrier period of the PWM signal. The waveform of the PWM signal is limited to such form as described above. Thus, when there is no significant change in the duty ratio by every carrier period, a large amount of higher harmonic wave component of the carrier period is to be contained in a sine wave signal which is generated based on the PWM signal. If the frequency of the higher harmonic wave component is an audio frequency, noise is generated.

SUMMARY OF THE INVENTION

Therefore, an object of the present invention is to reduce the generation of noise by dispersing the higher harmonic wave component contained in the sine wave signal which is generated based on the PWM signal, through changing the timing for generating the pulse of the PWM signal.

In order to overcome the foregoing problem, the present invention comprises the following configuration.

The PWM circuit of the present invention comprises a PWM counter for counting a clock signal, a reference value setting register which sets a comparative reference value for determining a duty ratio of a PWM signal, a comparator which generates the PWM signal from a comparative result of the comparative reference value and a count value of the PWM counter, a delay device for delaying the PWM signal, and a switching device which switches and outputs an output of the comparator and an output of the delay device in order of time sequence. It is preferable that the switching device switch the output of the comparator and the output of the delay device by synchronizing with the carrier period of the PWM signal.

With this structure, the comparator compares the count value of the clock signal counted by the PWM counter and the comparative reference vale and generates a PWM signal to be in active in a prescribed period, and the delay device delays the PWM signal. The switching device switchably outputs the output of the comparator and the output of the delay device in order according to the time sequence. Thus, the output of the switching device becomes the PWM signal at last. The phase in the effective pulse period of the PWM signal generated in this manner is shifted in the timing-axial direction time-sequentially. As a result, it is possible to disperse the higher harmonic wave component contained in a sine wave signal generated from this PWM signal in the timing-axial direction. Therefore, generation of noise can be prevented.

In the present invention, it is preferable to further comprise a delay time controller for setting delay time values which are different from each other in the delay device in accordance with the time sequence. The delay time controller may comprise a delay-time-setting time register for storing delay times different from each other, and it reads out delay time in order from the delay-time-setting time register to be set in the delay device. Further, the delay time controller may comprise a random-number generating circuit for setting the delay time as a random number for setting the delay time set by the random-number generating circuit in the delay device.

With this structure, by changing the delay time to be set in the delay time setting register in the delay time controller, the shift amount in the effective pulse period of the PWM signal can be made variable so that the dispersing characteristic of the higher harmonic wave component contained in the sine wave signal generated form the PWM signal can be improved. Further, by changing the delay time in random numbers by the random-number generating circuit of the delay time controller, the shift amount in the effective pulse of the PWM signal can be randomly varied so that higher harmonic wave component contained in the sine wave signal generated form the PWM signal can be more improved.

As the random number to be generated, it is preferable to be a value which enables to calculate an appropriate delay time based on a value of the count upper limit value setting register and a value of the reference value setting register.

Further, the PWM circuit of the present invention comprises a PWM counter for performing up/down count of a clock signal, a start point register for setting an effective pulse period start point of a PWM signal, an end point register for setting an effective pulse period end point of the PWM signal, a switching device which switchably outputs the effective pulse period start point and the effective pulse period end point according to a state of the PWM counter either in up- or down-count state, and a comparator which generates the PWM signal from a comparative result of a count value of the PWM counter and an output of the switching device.

In this structure, the switching device selects the effective pulse period start point of the start point register when the PWM counter is in an up-count action, and supplies the selected effective pulse period start point to the comparator as the comparative reference value. The comparator compares the count value of the PWM counter to the effective pulse period start point as the comparative reference value and generates the PWM signal. In the meantime, when the PWM counter is in a down-count action, the switching device selects the effective pulse period end point of the end point register and supplies the selected effective pulse period end point to the comparator as the comparative reference value. The comparator compares the count value of the PWM counter and the end point setting value as the comparative reference value and generates the PWM signal. When the start point setting value is set lower than the center value and the end point setting value is set higher than the center value, the effective pulse period of the PWM signal becomes relatively early in the timing-axial direction. Inversely, when the start point setting value is set higher than the center value and the end point setting value is set lower than the center value, the effective pulse period of the PWM signal becomes relatively slow in the timing-axial direction. As a result, the dispersing characteristic of the higher harmonic wave component contained in the sine wave signal generated from the PWM signal can be increased. As the center value, a half value of the count upper limit value may be set, for example.

Furthermore, the PWM circuit of the present invention comprises: a PWM counter for counting a clock signal; a reference value setting register which sets a comparative reference value for determining a duty ratio of a PWM signal; a phase-adjusting-amount controller which sets a phase adjusting amount of the PWM signal by a carrier period unit; a comparative value controller for controlling the comparative reference value; and a comparator which generates the PWM signal from a comparative result of the comparative reference value controlled by the comparative value controller and a count value of the PWM counter. The comparative value controller comprises: an adder for performing add-processing of a first phase adjusting amount to the comparative reference value; a subtractor for performing subtract-processing of a second phase adjusting amount from the comparative reference value; and a switching device which switchably outputs an output of the adder and an output of the subtractor according to a position of the PWM counter either for up- or down-count. The comparator generates the PWM signal based on a comparative result of the count value of the PWM counter and an output of the switching device.

In this structure, when the PWM counter is in an up-count action, the comparative value controller subtracts (or adds) the first or second phase adjusting amount from (to) the comparative reference value and sets the comparative reference value at the time of the up-count action relatively low (or high). As a result, the start point of the effective pulse period of the PWM signal comes relatively early (or relatively slow). Further, when the PWM counter is in a down-count action, the comparative value controller adds (or subtracts) the first or second adjusting amount to (from) the comparative reference value and sets the comparative value at the time of the down-count action relatively high (or low). As a result, the end point of the effective pulse period of the PWM signal comes relatively early (or relatively slow). By changing the first and second phase adjusting amount values, the position in the timing-axial direction of the effective pulse period of the PWM signal can be adjusted. As a result, the dispersing characteristic of the higher harmonic wave component contained in the sine wave signal generated from the PWM signal can be more improved. In this case, by setting the first phase adjusting amount and the second phase adjusting amount to be the same value, the position adjusting amount of the PWM signal in the timing-axial direction can be unified to be relatively slow/early.

It is preferable that the PWM circuit further comprise a phase shift direction setting device which sets a phase sift direction of the PWM signal, and the switching device further controls switching of an output of the adder and an output of the subtractor according to a phase sift direction which is set by the phase shift direction setting device. With this, the phase in the effective pulse period of the PWM signal comes relatively early with respect to the center of the carrier period when the phase shift direction by the phase shift direction setting device indicates the leading direction. Inversely, when the phase shift direction by the phase shift direction setting device indicates the delay direction, the phase in the effective pulse period of the PWM signal comes relatively slow with respect to the center of the carrier period. In addition, by changing the phase adjusting amount, it is possible to achieve a fine adjustment of the position of the effective pulse period of the PWM signal in the timing-axial direction. As a result, it is possible to disperse the higher harmonic component contained in the sine wave signal generated from the PWM signal in a still wider range.

The PWM circuit of the present invention comprises: a PWM counter for counting a clock signal; a start point register for setting an effective pulse period start point of a PWM signal by a carrier period unit; an end point register for setting an effective pulse period end point of the PWM signal by a carrier period unit; a first comparator which compares a count value of the PWM counter and the effective pulse period start point; a second comparator which compares a count value of the PWM counter and the effective pulse period end point; and a logic synthesizing circuit which generates and outputs the PWM signal by logic-synthesizing a comparative result signal of the first comparator and a comparative result signal of the second comparator.

In this case, it is preferable that the PWM counter be an up-counter or a down-counter but not an up/down counter. In this structure, two comparators and the logic synthesizing circuit are used instead of using the switching device which performs switching action when the PWM counter is in the count action. An exclusive OR circuit may be used as the logic synthesizing circuit.

In this structure, when the count value of the PWM counter exceeds (comes below) the start point setting value in the first comparator, a start edge of the PWM signal is generated. Also, when the count value of the PWM counter exceeds (comes below) the end point setting value in the second comparator, an end edge of the PWM signal is generated. By adjusting the start point setting value and the end point setting value, it is possible to adjust the position of the effective pulse of the PWM signal in the timing-axial direction. Therefore, it is possible to disperse the higher harmonic wave component contained in the sine wave signal generated from the PWM signal in a wide range.

The PWM circuit of the present invention comprises: a carrier period controller which switchably sets a carrier period of a PWM signal and a double-speed of the carrier period by a carrier period unit; an upper limit value setting device which sets a count upper limit value of the PWM signal in the carrier period by synchronizing with a set cycle of the carrier period and sets a half count upper limit value in the double-speed period by synchronizing with a set cycle of the double-speed period; a PWM counter for performing up/down count of a clock signal until reaching a set value of the upper limit value setting device; a comparative reference value setting device which sets a comparative reference value for determining a duty ratio of a PWM signal in the carrier period by synchronizing with the set cycle of the carrier period and sets a half comparative reference value for determining a duty ratio of the PWM signal in the double-speed period by synchronizing with the set cycle of the double-speed period; and a comparator which generates the PWM signal according to a comparative result of the set value of the comparative reference value setting device and a count value of the PWM counter.

In this structure, in the period where the carrier period controller sets the double-speed period, the number of count action of the PWM counter in a regular single carrier period becomes twice as many and the comparative reference value in each count action becomes a half the comparative reference value. Thereby, the effective pulse period of the PWM signal can be divided into two. Thus, it is possible to improve the dispersing characteristic of the higher harmonic wave component contained in the sine wave signal generated from the PWM signal.

In this case, it is preferable to further comprise an interruption output controller, wherein the interruption controller outputs an interruption signal indicating that it has reached an upper/lower limit value at a point where a count value of the PWM counter reaches a count upper/lower limit value in a set cycle of the carrier period, does not output an interruption signal at a point where the count value of the PWM counter reaches a count upper limit value in a set cycle of the double-speed period, outputs an interruption signal indicating that it has reached a count upper limit value at a point where the count value of the PWM counter reaches a count lower limit value for the first time in a set cycle of the double-speed period, and outputs an interruption signal indicating that it has reached a count lower limit value at a point where the count value of the PWM counter reaches the count lower limit value for the second time in a set cycle of the double-speed period. With this, even when the count state of the PWM counter is changed by the carrier period controller, it is possible to supply the same interruption signal as the case of the PWM circuit in a structure having no mode for changing the count state, which serves as the interruption signal for the CPU when overflow or underflow is caused in the PWM counter by a function of the interruption output controller. Therefore, there is no increase on the load to be imposed on software.

In any of the above-described PWM circuit, it is possible to employ a structure with a count upper limit value setting register which sets the count upper limit value for determining the carrier period of the PWM signal in the PWM counter is connected to the PWM counter. With this, by setting the count upper limit value arbitrarily by the count upper limit value setting register, it is possible to change the carrier period of the PWM signal.

The PWM circuit control method of the present invention is for generating a PWM signal based on a comparison of a comparative reference value and a count value which is obtained by repeatedly performing up/down count of a clock signal by a PWM counter, the method comprising the steps of: setting a comparative reference value for down-count at a point where a count value reaches a count upper limit value in an up-count action of the PWM counter; and setting a comparative reference value for up-count at a point where a count value reaches a count lower limit value in a down-count action of the PWM counter.

In this structure, when the comparative reference value for the up-count action is set relatively small and the comparative reference value for the down-count action is set relatively large, the effective pulse period of the PWM signal comes relatively early in the timing-axial direction. Inversely, when the comparative reference value for the up-count action is set relatively large and the comparative reference value for the down-count action is set relatively small, the effective pulse period of the PWM signal comes relatively slow in the timing-axial direction. As a result, it is possible to disperse the higher harmonic wave component contained in a sine wave signal generated from this PWM signal in the timing-axial direction. Therefore, generation of noise can be prevented.

When the comparative reference value is set relatively small, a prescribed adjusting value may be subtracted from the center value and, when the comparative reference value is set relatively large, a prescribed adjusting amount may be added to the center value.

Further, the PWM circuit control method of the present invention is for generating a PWM signal based on a comparison of a comparative reference value and a count value which is obtained by repeatedly performing up/down count of a clock signal by a PWM counter, the method comprising the steps of: intermittently outputting a double-speed period setting command by synchronizing with a carrier period; changing a count upper limit value of the carrier period to a half value of the count upper limit value and also changing the comparative reference value to a half value of the comparative reference value upon recognizing an output of a double-speed period setting command; and generating a PWM signal based on a comparison of a count value of the PWM counter and the comparative reference value or the half value of the comparative reference value. Further, the step of generating the PWM signal sets the half value of the PWM counter upper limit value and the half value of the comparative reference value until pulse generation of the PWM signal is repeated twice after recognizing the output of the double-speed period setting command, and returns the half value of the count upper limit value and the half value of the comparative reference value to the count upper limit value and the comparative reference value when pulse generation of the PWM signal has repeated twice after recognizing the output of the double-speed period setting command.

With the PWM circuit control method, by giving the double-speed period setting command, the number of count action of the PWM counter in a regular single carrier period becomes twice as many and also the comparative reference value in each count action becomes a half the value of the regular case. Thereby, the effective pulse period of the PWM signal can be divided into two. Thus, it is possible to improve the dispersing characteristic of the higher harmonic wave component contained in the sine wave signal generated from the PWM signal.

With the present invention, it becomes possible to perform control for shifting the effective pulse period of the PWM signal in the timing-axial direction. Thus, the higher harmonic wave component contained in the sine wave signal which is generated based on this PWM signal can be dispersed in the timing-axial direction. Therefore, it enables to prevent generation of noise.

BRIEF DESCRIPTION OF THE DRAWINGS

The above and other objects of the present invention will become clear from the following description of the preferred embodiments taken in conjunction with the accompanying drawings. Those skilled in the art will appreciate that there are many other features and advantages of the present invention possible by embodying the present invention.

FIG. 1 is a block diagram for showing the structure of a PWM circuit according to a first embodiment of the present invention;

FIG. 21 is a block diagram for showing the structure of a PWM circuit according to a tenth embodiment of the present invention;

DETAILED DESCRIPTION OF THE INVENTION

In the followings, preferred embodiments of the present invention will be described by referring to the accompanying drawings.

Figure 25:
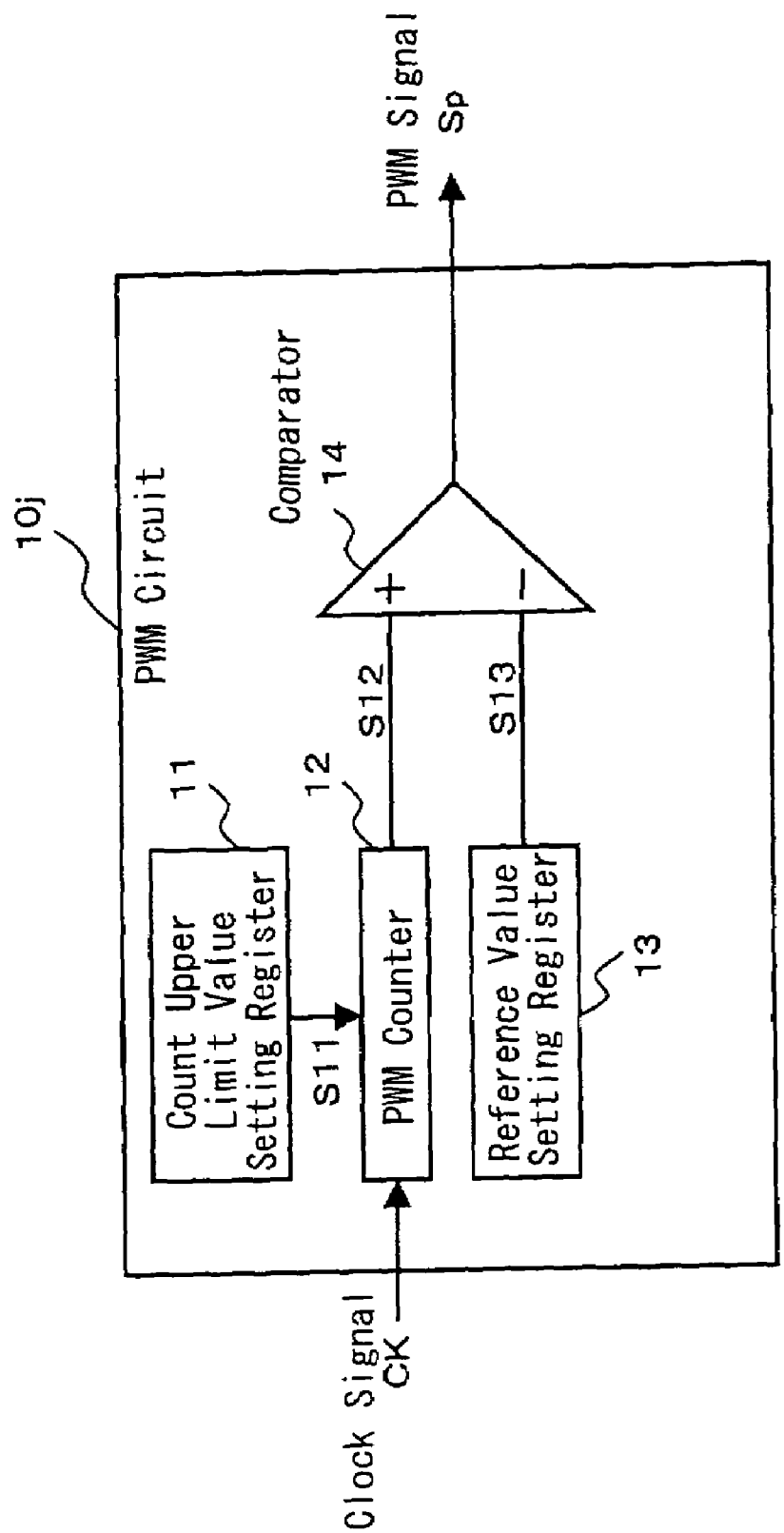
FIG. 25 is a block diagram for showing the basic structure of the PWM circuit to which the present invention is directed.

First, described by referring to the block diagram of FIG. 25 is the basic structure of the PWM circuit to which the present invention is directed.

This PWM circuit $10j$ comprises a count upper limit value setting register 11, a PWM counter 12, a reference value setting register 13, and a comparator 14.

The count upper limit value setting register 11 sets a count upper limit value S11 which is for determining carrier period of the PWM. The PWM counter 12 performs up/down count of clock signals CK. The reference value setting register 13 sets a comparative reference value S13 which is for determining the duty ratio of PWM signals Sp. The comparator 14 compares a count value S12 counted by the PWM counter 12 and the comparative reference value S13 set by the reference value setting register 13, and generates an active PWM signal Sp when the former value exceeds the latter value.

Figure 26:
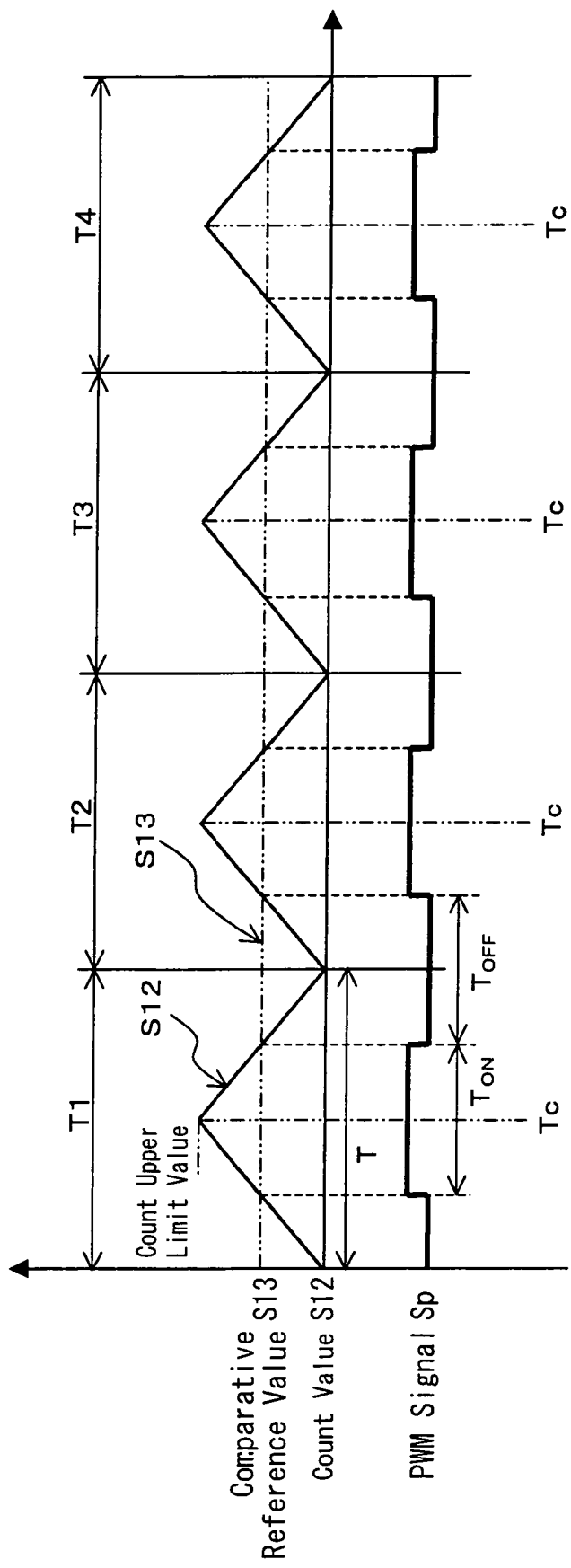
FIG. 26 is a timing chart for showing the action of the PWM circuit of FIG. 25.

FIG. 26 is a timing chart for showing the action of the PWM circuit $10j$. The PWM counter 12 counts the inputted clock signals CK. The count upper limit value S11 is inputted to the PWM counter 12 from the count upper limit value setting register 11. The PWM counter 12 performs up/down count between "0" and the count upper limit value S11. The count value S12 counted by the PWM counter 12 is inputted to a noninverting input terminal (+) of the comparator 14. The comparative reference value S13 set by the reference value setting register 13 is inputted to an inverting input terminal (−) of the comparator 14. The comparator 14 compares the count value S12 and the comparative reference value S13. The comparator 14 outputs "L" level as the PWM signal Sp when the count value S12 is below the comparative reference value S13, outputs "H" level as the PWM signal Sp when the count value S12 exceeds the comparative reference value 13, and outputs the "L" level as the PWM signal Sp when the count value S12 again comes below the comparative reference value S13.

Figure 27:
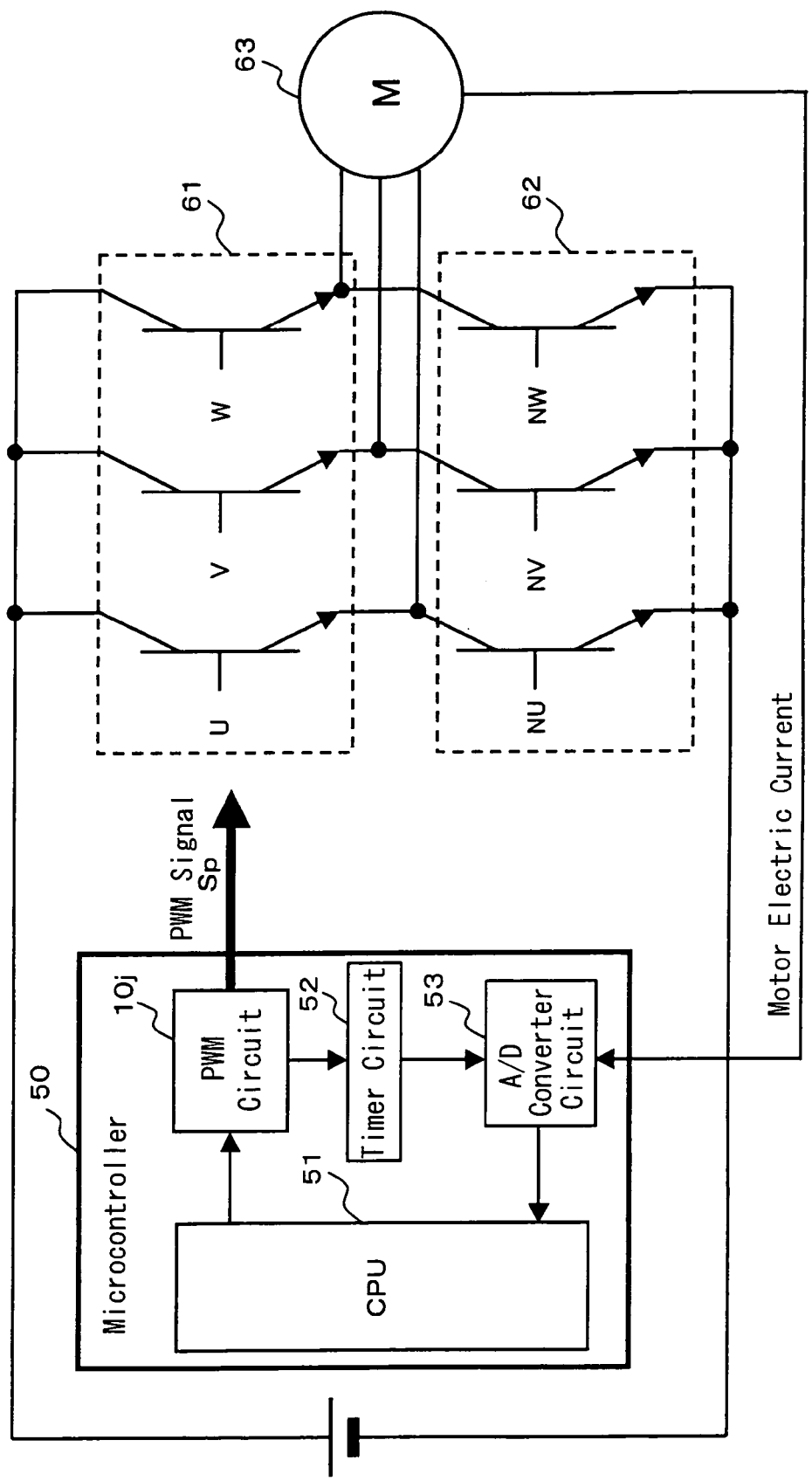
FIG. 27 is a block diagram for showing the structure of a motor control system by a microcontroller having the PWM circuit of FIG. 25.

FIG. 27 is a block diagram for showing the structure of a motor control system using a microcontroller 50 with the PWM circuit $10j$. The microcontroller 50 comprises a CPU 51, the PWM circuit $10j$, a timer circuit 52, and an A/D converter circuit 53. ON/OFF of power transistors 61, 62 is controlled by the PWM signal Sp outputted from the PWM circuit $10j$ so as to generate a sine wave signal. The generated sine wave signal is applied to a motor 63 and the motor electric current is also fed back to the microcontroller 50 for drive-controlling the motor 63.

Figure 28:
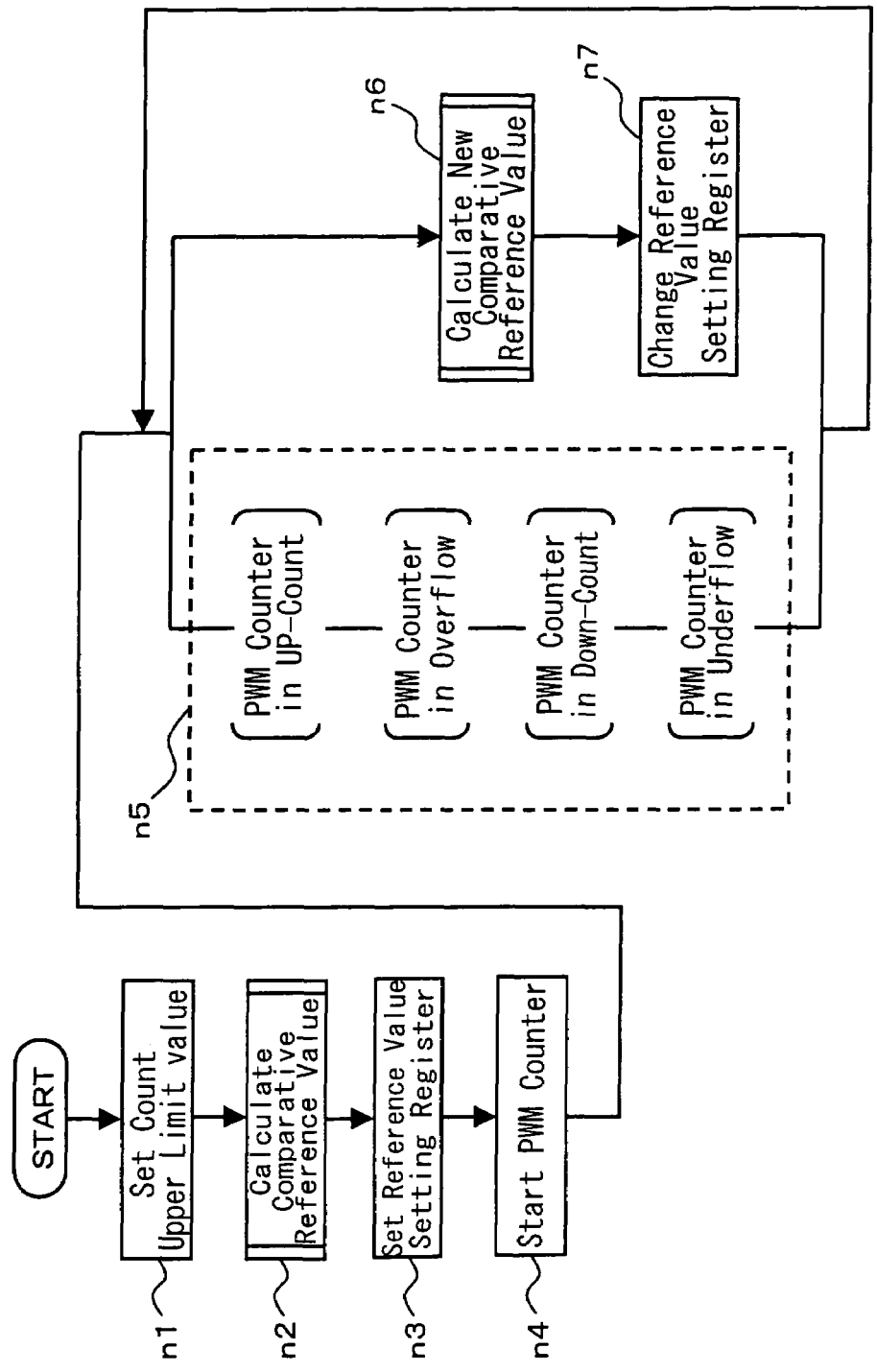
FIG. 28 is a flowchart regarding software of the motor control system of FIG. 27.

FIG. 28 is a flowchart regarding software of the above-described motor control system.

In a step n1, the count upper limit value S11 is set in the count upper limit value setting register 11. Then, in a step n2, the comparative reference value S13 for determining the duty ratio is calculated from the count upper limit value S11. In a step n3, the comparative reference value S13 is set in the reference value setting register S13. Then, in a step n4, a count action by the PWM counter 12 is started.

In steps n5, n6, n7, the comparative reference value S13 of the reference value setting register 13 is changed by every carrier period for controlling the duty ratio of the PWM signal Sp. With this, inverter control can be achieved. In this case, the count upper limit value S11 in the count upper limit value setting register 11 is not changed.

As described above, by changing the comparative reference value S13 by every carrier period while keeping the count upper limit value S11 (carrier period T) constant, the duty ratio which is the ratio between an effective pulse period $T_{ON}$ and OFF period $T_{OFF}$ is adjusted in the PWM signal Sp.

However, the effective pulse period TON of the PWM signal Sp has a waveform which is symmetrical with respect to the center Tc of the carrier period T. Since the waveform of the PWM signal Sp is limited as described above, a large amount of higher harmonic component of the carrier period is contained in the sine wave signal which is generated based on the PWM signal Sp, when the duty ratio does not significantly change by every carrier period. Thus, if the frequency of the higher harmonic component is a radio frequency, noise is generated.

Each embodiment of the present invention which enables to overcome such problems will be described hereinafter.

First Embodiment

FIG. 1 is a block diagram for showing the structure of a PWM circuit 10a according to a first embodiment of the present invention.

The PWM circuit 10a comprises a count upper limit value setting register 11, a PWM counter 12, a reference value setting register 13, and a comparator 14.

The count upper limit value setting register 11 sets a count upper limit value S11 for determining a carrier period of the PWM. The PWM counter 12 performs up/down count of clock signals CK. The reference value setting register 13 sets a comparative reference value for determining the duty ratio of a PWM signal Sp. The comparator 14 compares a count value S12 counted by the PWM counter 12 and the comparative reference value S13 set by the reference value setting register 13, and generates an active PWM signal Sp when the former value exceeds the latter value.

The count value S12 counted by the PWM counter 12 is inputted to a noninverting input terminal (+) of the comparator 14. The comparative reference value S13 set by the reference value setting register 13 is inputted to an inverting input terminal (−) of the comparator 14. The aforementioned structural elements are the same as those of the related art, however, the following features are provided additionally in this embodiment.

That is, the embodiment is provided with a delay device 16, a selection controller 17, and a switching device 18. The delay device 16 comprises a delay counter 15 which delays a comparative result signal S14 from the comparator 14 for generating a delay signal S16. The selection controller 17 outputs a switching control signal S17 which repeats "H" and "L" by every carrier period T. The switching device 18 switches the comparative result signal S14 from the comparator 14 and the delay signal S16 from the delay device 16 by every carrier period T according to the switching control signal S17 from the selection controller 17.

Figure 2:
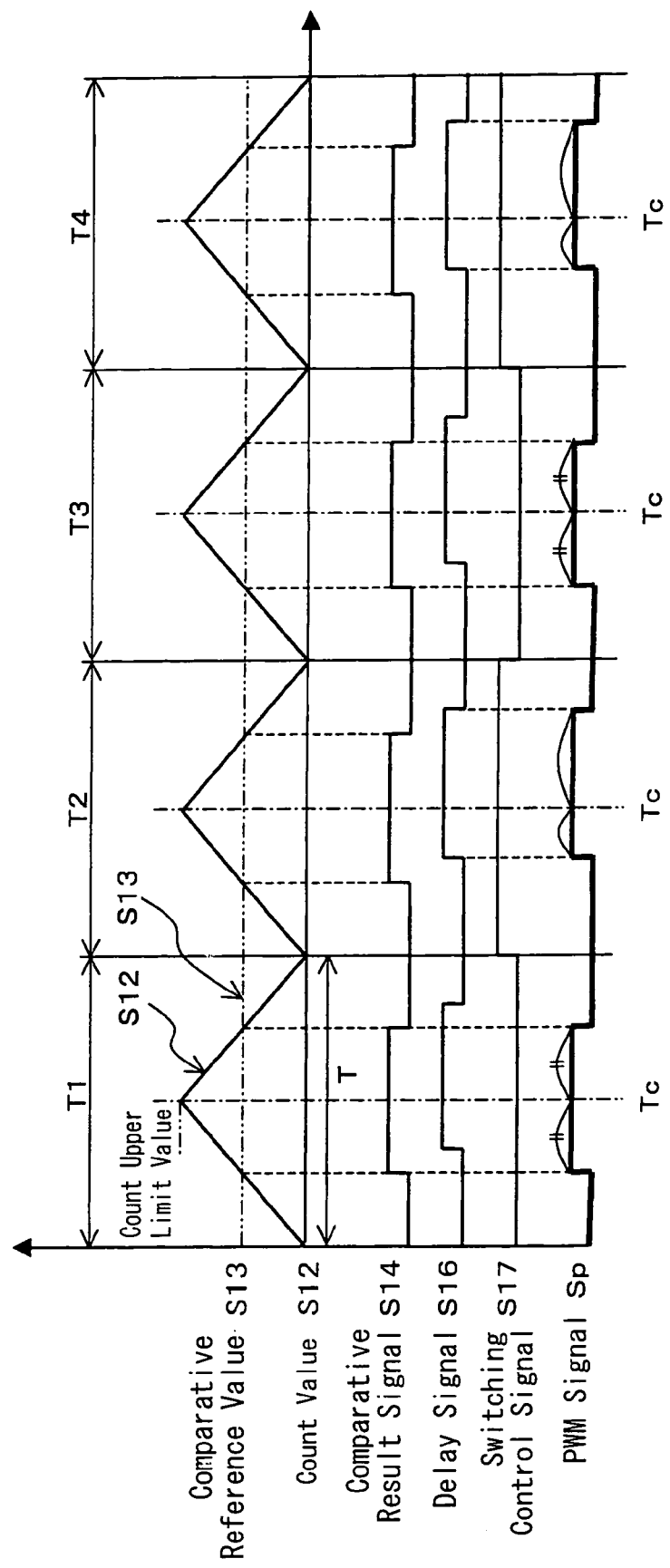
FIG. 2 is a timing chart for showing the action of the PWM circuit according to the first embodiment of the present invention.

FIG. 2 is a timing chart for showing the action of the PWM circuit 10a of this embodiment.

The PWM counter 12 inputs the clock signal CK, performs up/down count between "0" and the count upper limit value set by the count upper value setting register 11, and outputs the count value S12 to the comparator 14. Te comparator 14 compares the count value S12 to the comparative reference value S13 set by the reference value setting register 13. The comparator 14 outputs the "L"-level comparative result signal S14 when the count value S12 is below the comparative reference value S13, and outputs the "H"-level comparative result signal S14 when the count value S12 exceeds the comparative reference value S13, respectively. The comparative result signal S14 having such signal form becomes the base signal of the PWM signal Sp.

The comparative result signal S14 is outputted to the delay device 16 and the switching device 18. The delay device 16 delays the inputted comparative result signal S14 for generating the delay signal S16 to be outputted to the switching device 18. Based on the switching control signal S17 supplied from the selection controller 17, the switching device 18 selectively switches the comparative result signal S14 and the delay signal S16 by every carrier period T. The switching device 18 outputs as the PWM signal Sp the comparative result signal S14 or the delay signal S16, which is being selectively switched.

The switching control signal S17 is in the "L" level in a first period T1 so that the switching device 18 selects the comparative result signal S14. The switching control signal S17 is in the "H" level in a second period T2 so that the switching device 18 selects the delay signal S16. The switching control signal S17 is in the "L" level in a third period T3 so that the switching device 18 selects the comparative result signal S14. The switching control signal S17 is in the "H" level in a fourth period T4 so that the switching device 18 selects the delay signal S16.

The PWM signal Sp becomes the comparative result signal S14 in the first period T1, the delay signal S16 in the second period T2, the comparative result signal S14 in the third period, and the delay signal S16 in the fourth period T4. In the first period T1 and the third period T3, the waveform of the PWM signal Sp in the effective pulse period becomes symmetrical with respect to the center Tc of the carrier period T. On the contrary, in the third period T3 and fourth period T4, the waveform of the PWM signal Sp in the effective pulse period becomes asymmetrical with respect to the center Tc of the carrier period T. As described above, this embodiment enables to disperse the phases of the PWM signal Sp in the effective pulse period in the timing-axial direction by switchably setting the comparative result signal S14 and the delay signal S16.

As a result, for the sine wave signal generated from the PWM signal Sp by the inverter control, the phases of the higher harmonic component contained therein are dispersed. The structure thereof can be achieved by a relatively simple circuit which is obtained by adding the delay device 16, the selection controller 17, and the switching device 18 to the PWM circuit of the related art.

Second Embodiment

Figure 3:
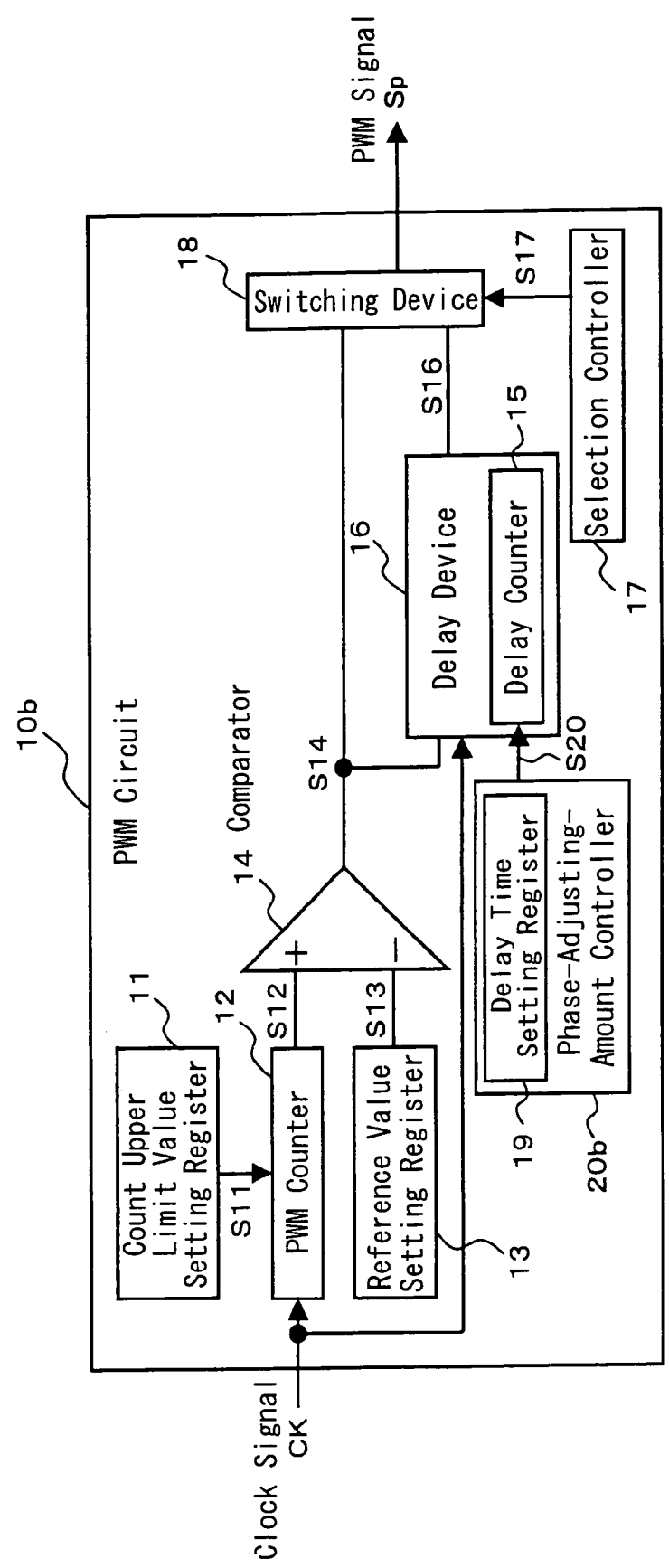
FIG. 3 is a block diagram for showing the structure of a PWM circuit according to a second embodiment of the present invention.

FIG. 3 is a block diagram for showing the structure of a PWM circuit 10b according to a second embodiment of the present invention.

In FIG. 3, the same reference numerals as those used in FIG. 1 of the first embodiment indicate the same structural elements. Thus, the detailed description thereof will be omitted. This embodiment comprises a phase-adjusting-amount controller 20b in addition to the structural elements shown in FIG. 1. The phase-adjusting-amount controller 20b has a built-in delay time setting register 19 which can set the count value of the delay counter 15 in the delay device 16 to an arbitrary value.

Figure 4:
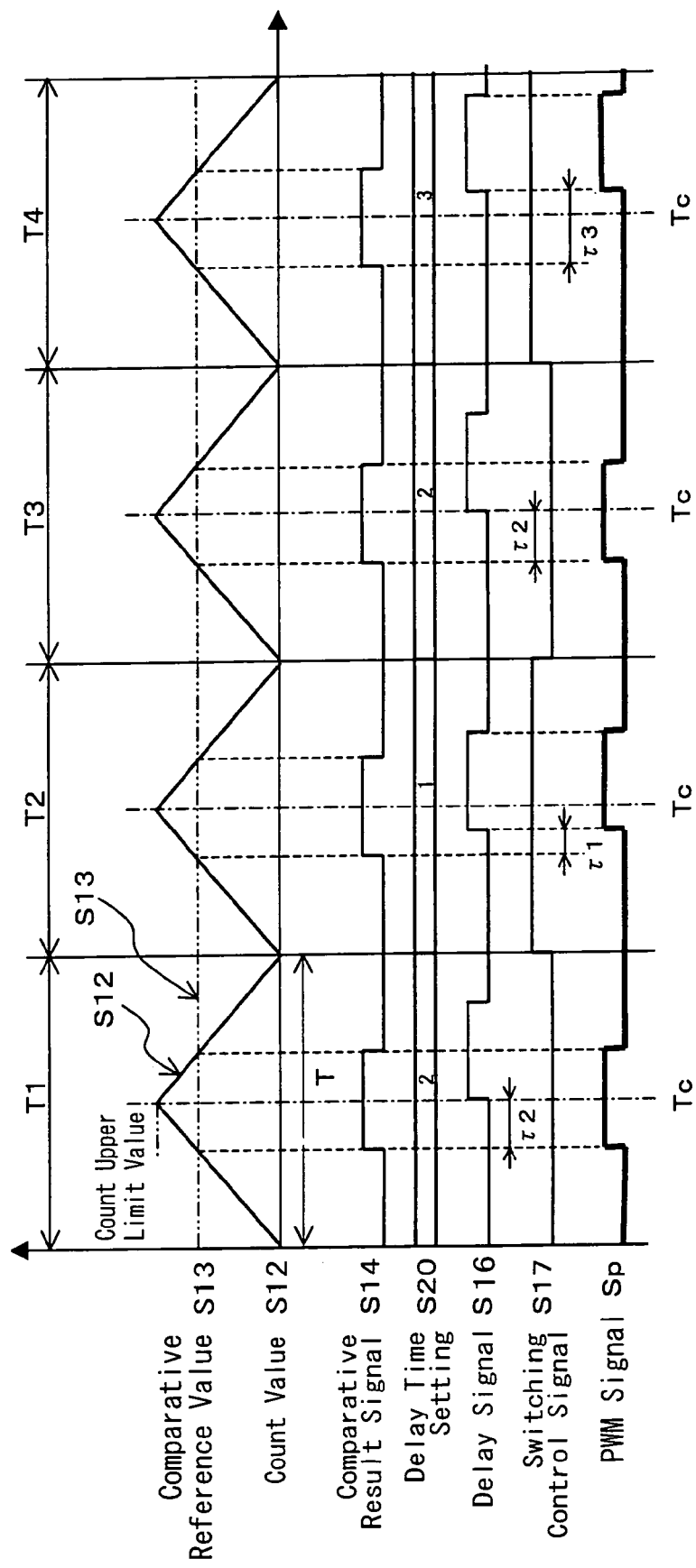
FIG. 4 is a timing chart for showing the action of the PWM circuit according to the second embodiment of the present invention.

FIG. 4 is a timing chart for showing the action of the PWM circuit 10b of this embodiment. The delay time setting register 19 of the phase-adjusting-amount controller 20b sets the delay time which varies for each carrier period T. Delay time $\tau 1$, $\tau 2$, $\tau 3$ of the delay signal S16 for the comparative result signal S14 is changed for each carrier period T. Thereby, the phase in the effective pulse period of the PWM signal Sp which is made of a combination of the comparative result signal S14 and the delay signal S16 can be more dispersed in the timing-axial direction compared to the case of the first embodiment. As a result, for the sine wave signal which is generated based on the PWM signal Sp, the higher harmonic component contained therein can be dispersed more minutely compared to the case of the first embodiment.

Third Embodiment

Figure 5:
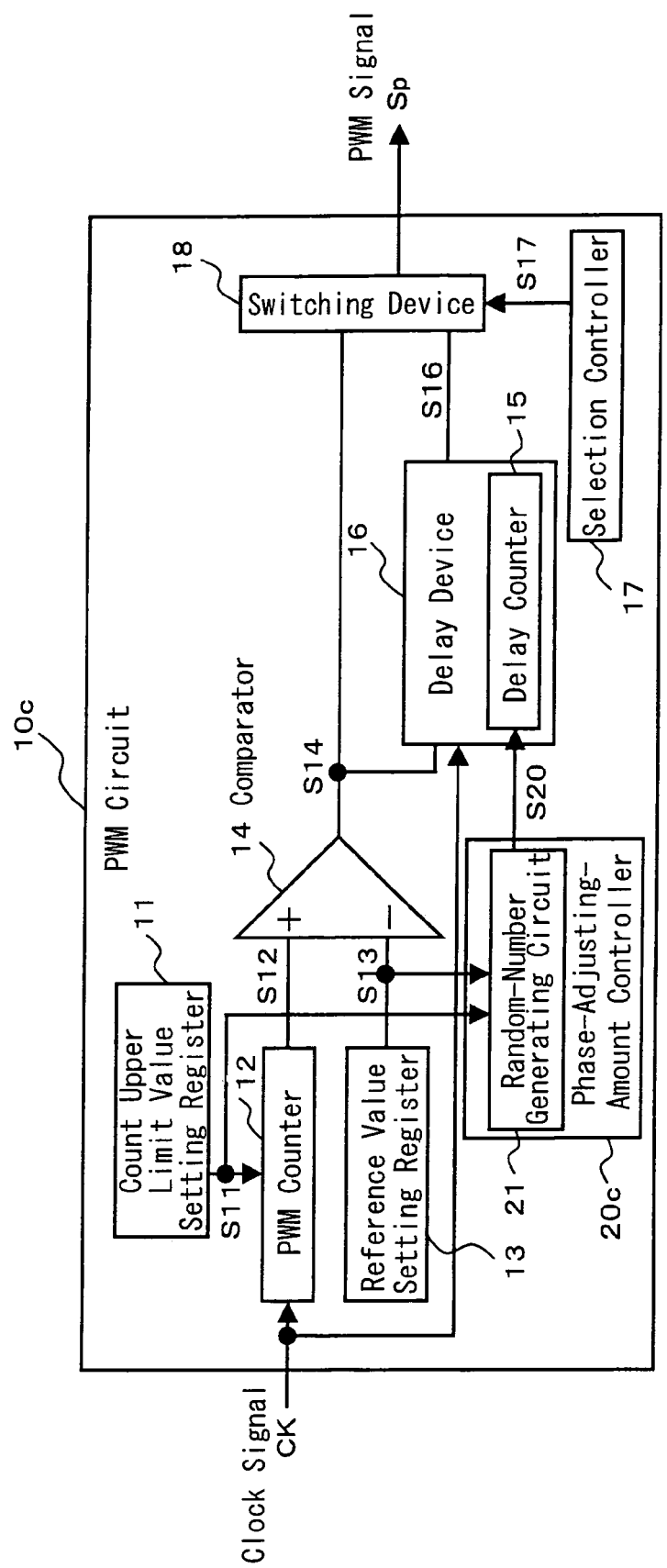
FIG. 5 is a block diagram for showing the structure of a PWM circuit according to a third embodiment of the present invention.

FIG. 5 is a block diagram for showing the structure of a PWM circuit 10c according to a third embodiment of the present invention.

In FIG. 5, the same reference numerals as those used in FIG. 1 showing of the first embodiment indicate the same structural elements. Thus, the detailed description thereof will be omitted. This embodiment comprises a phase-adjusting-amount controller 20c in addition to the structural elements shown in FIG. 1. The phase-adjusting-amount controller 20c has a built-in random-number generating circuit 21 which can set the count value of the delay counter 15 in the delay device 16 as random numbers. The random-number generating circuit 21 calculates an appropriate delay time based on the count upper limit value S11 of the count upper limit value setting register 11 and the comparative reference value S13 of the reference value setting register 13.

Figure 6:
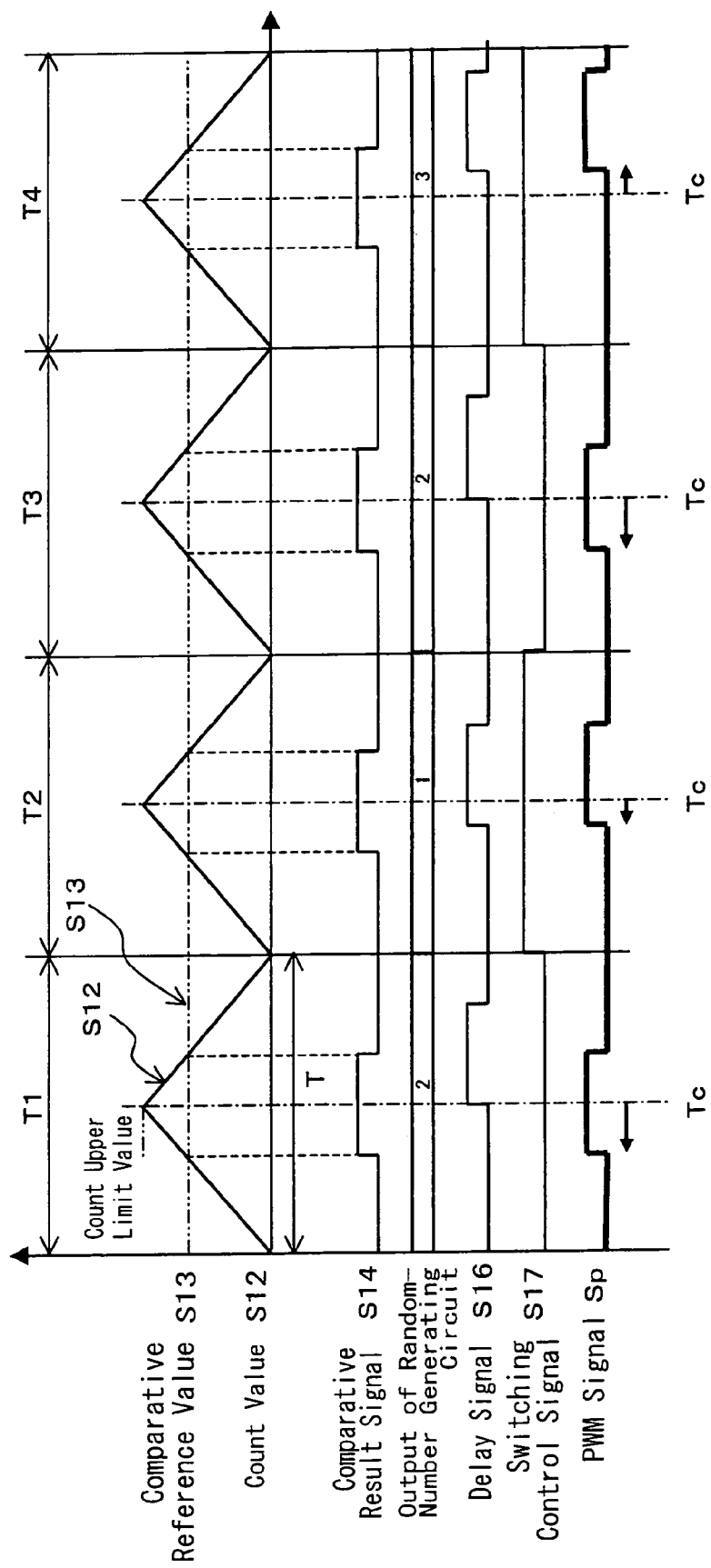
FIG. 6 is a timing chart for showing the action of the PWM circuit according to the third embodiment of the present invention.

FIG. 6 is a timing chart for showing the action of the PWM circuit 10c of this embodiment. The random-number generating circuit 21 automatically calculates an appropriate delay time from the count upper limit value S11 and the comparative reference value S13. In this embodiment, the random-number generating circuit 21 serves as the main component for setting the delay time which varies for each carrier period T. Thus, it is not necessary in this embodiment to set the delay time which varies for each carrier period T in software whereas it is set in software in the second embodiment. Therefore, it is possible to disperse the higher harmonic wave component contained in the sine wave signal generated from the PWM signal with the same software as that of the related art. Furthermore, the extent of dispersion of the higher harmonic wave component contained in the sine wave signal can be more increased since the delay time is set in random numbers.

Fourth Embodiment

Figure 7:
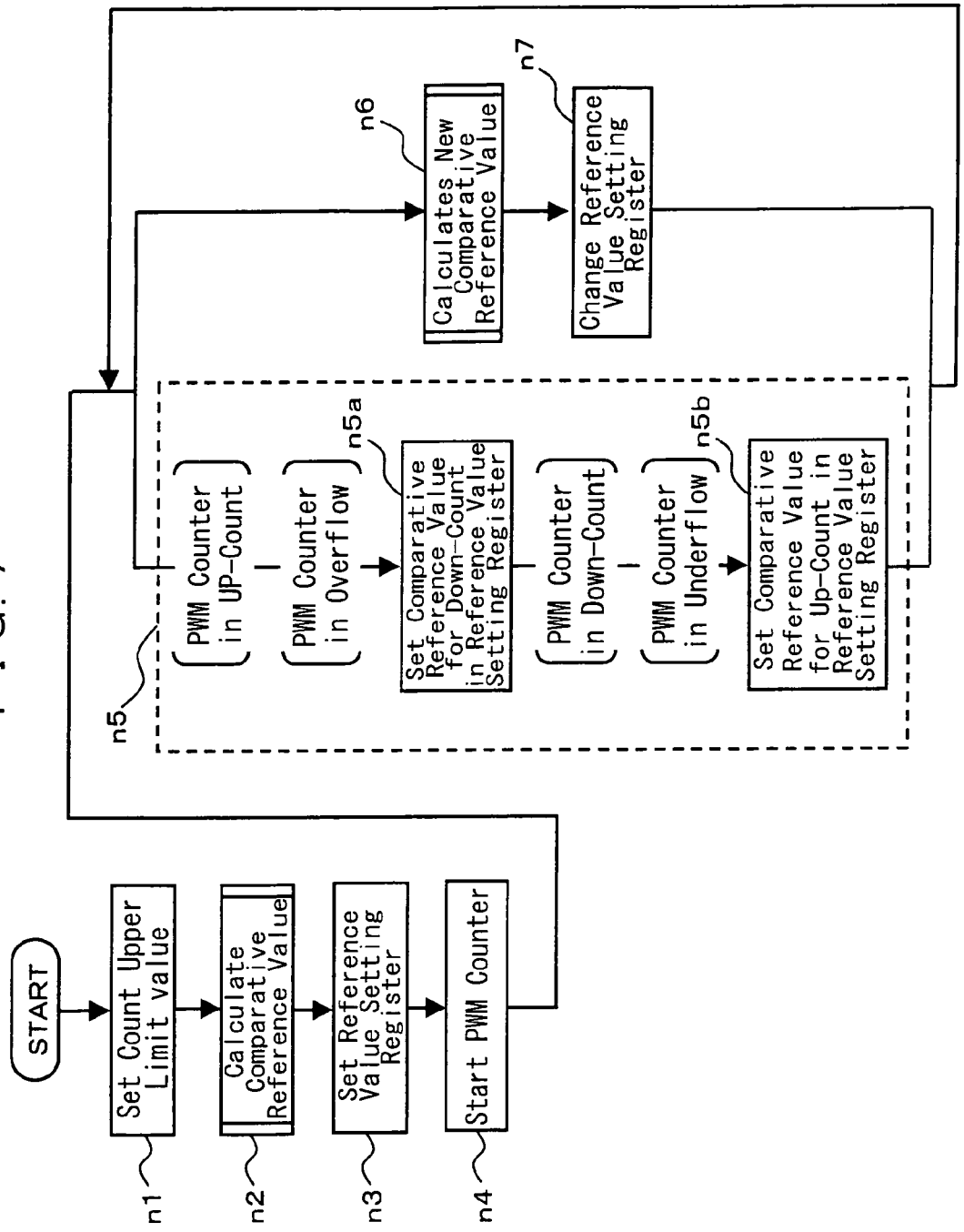
FIG. 7 is a flowchart for showing the structure of software which executes control of a PWM circuit according to a fourth embodiment of the present invention.

FIG. 7 is a flowchart for showing the structure of software which executes the control of a PWM circuit according to a fourth embodiment of the present invention.

In FIG. 7, the components with the same reference numerals as those of FIG. 28 are the structures which perform the same processing as those shown in FIG. 28. Thus, the detailed description thereof will be omitted. It is distinctive in respect that a comparative reference value for down-count is set in the reference value setting register 13 in a step n5a which is executed at the point where the PWM counter 12 overflows and that a comparative reference value for up-count is set in the reference value setting register 13 in a step n5b which is executed at the point where the PWM counter 12 underflows. Specifically, in every half-period (T/2) of the carrier period T, the comparative reference value S13 is changed periodically from the up-count comparative reference value to the down-count comparative reference value or from the down-count comparative reference value to the up-count comparative reference value.

Figure 8:
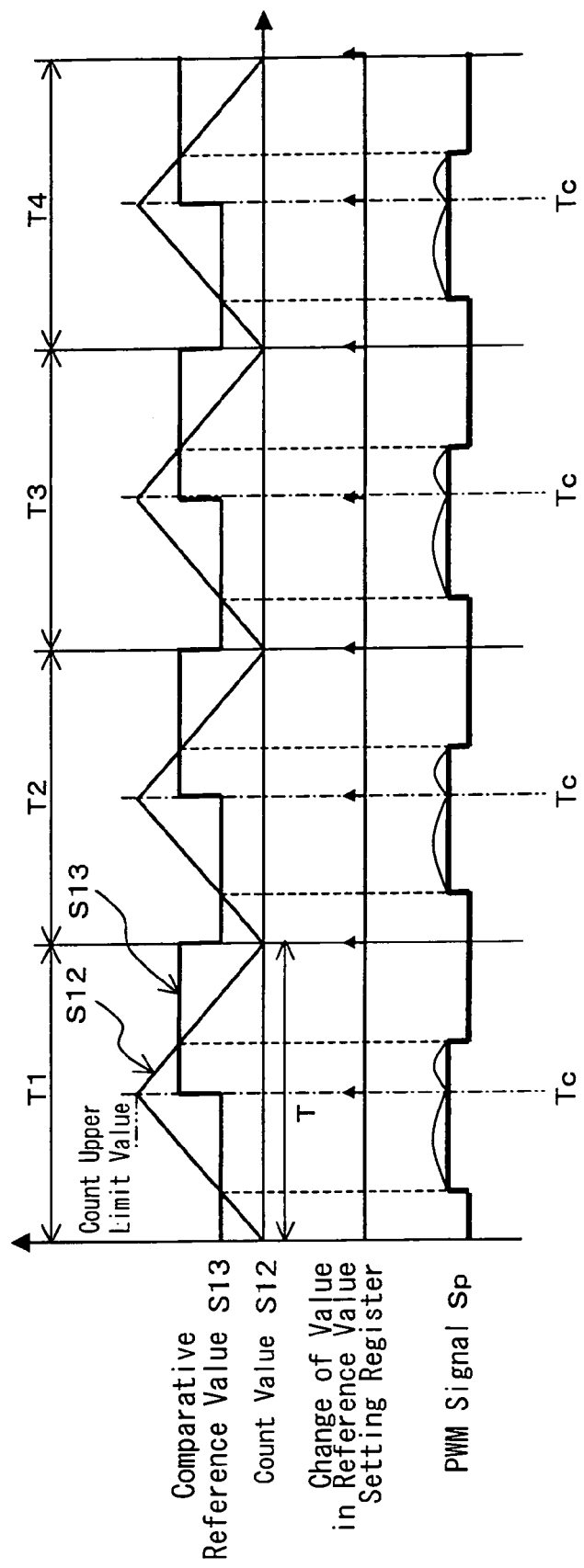
FIG. 8 is a timing chart for showing the action of the software according to the fourth embodiment of the present invention.

FIG. 8 is a timing chart for showing the action of this embodiment. The reference value setting register 13 executes the changing processing of the comparative reference value S13 by synchronizing with the overflow in the up-count action of the PWM counter 12 and the underflow in the down-count action. Thereby, the different values for the up-count and the down-count actions of the PWM counter 12 are set in the reference value setting register 13. The overflow herein means that the count value reaches the count upper limit value when the PWM counter 12 is in the up-count action. In the meantime, the underflow means that the count value reaches the count lower limit value ("0") when the PWM counter 12 is in the down-count action.

At the time of overflow generated during the up-count action, by setting as the comparative reference value S13 the down-count comparative reference value which is increased to be more than the reference value, the fall timing of the PWM signal Sp from the "H" level to the "L" level at the time of down-count action becomes earlier than the reference. Also, by setting as the comparative reference value S13 the up-count comparative reference value which is decreased to be less than the reference value at the time of underflow generated during the down-count action, the rise timing of the PWM signal Sp from the "L" level to the "H" level at the time of up-count action becomes earlier than the reference. By setting the comparative reference values in the manner as described above, the phase of the PWM signal Sp becomes earlier than the reference as a result.

Inversely, at the time of overflow generated during the up-count action, by setting the down-count comparative reference value which is decreased to be less than the reference value as the comparative reference value S13, the fall timing of the PWM signal Sp from the "H" level to the "L" level at the time of down-count becomes slower than the reference. Also, by setting the up-count comparative reference value which is increased to be more than the reference value as the comparative reference value S13 at the time of underflow generated during the down-count action, the rise timing of the PWM signal Sp from the "L" level to the "H" level at the time of up-count becomes slower than the reference. By setting the comparative reference values in the manner as described above, the phase of the PWM signal Sp becomes slower than the reference as a result.

In both cases, by equalizing the amount of increase and the amount of decrease with respect to the reference value, the duty ratio of the PWM signal Sp becomes equal to the duty ratio of the reference as a result.

With this embodiment, the higher harmonic wave component contained in the sine wave signal generated based on the PWM signal Sp can be dispersed in a still wider range.

The reference in the above-described processing refers to the changing timing of the PWM signal Sp which is obtained at the time of up-count or down-count action while keeping the reference value state without changing the comparative reference value S13.

Fifth Embodiment

Figure 9:
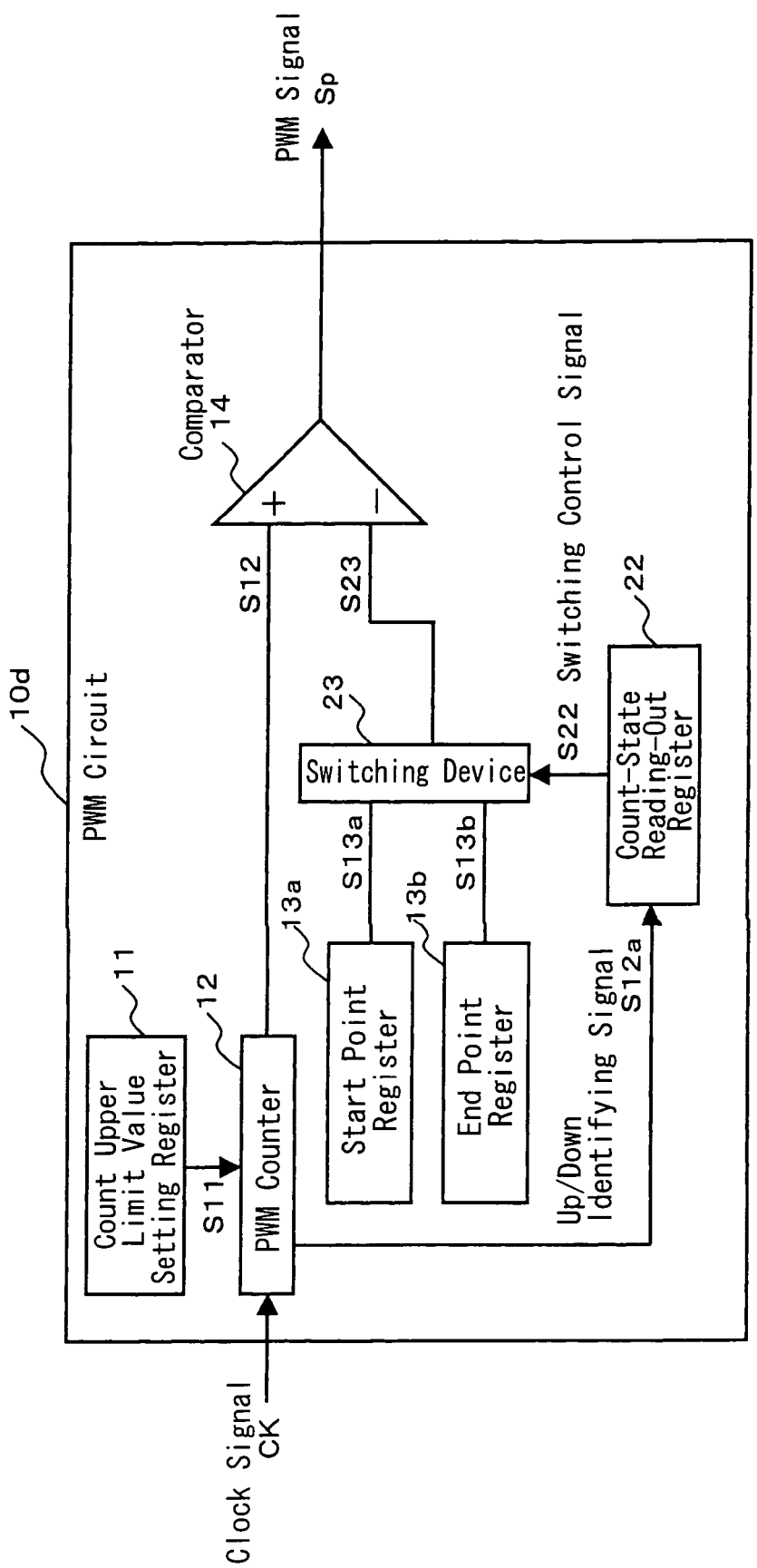
FIG. 9 is a block diagram for showing the structure of a PWM circuit according to a fifth embodiment of the present invention.

FIG. 9 is a block diagram for showing the structure of a PWM circuit 10d according to a fifth embodiment of the present invention.

The PWM circuit 10d comprises a count upper limit value setting register 11, a PWM counter 12, a start point register 13a, an end point resister 13b, a count-state reading-out register 22, a switching device 23, and a comparator 14.

The count upper limit value setting register 11 sets the count upper limit value for determining the carrier period of the PWM. The PWM counter 12 performs up/down count of the clock signals CK. The start point register 13a sets the start point setting value of the effective pulse period of the PWM signal Sp. The end point register 13b sets the end point setting value of the effective pulse period. The count-state reading-out register 22 generates and outputs a switching control signal S22 based on an up/down identifying signal S12a which indicates whether the PWM counter 12 is in the up-count state or in the down-count state. The switching device 23 switches the start point setting value S13a from the start point register 13a and the end point setting value S13b from the end point register 13b by every carrier period T based on a switching control signal S22 from the count-state reading-out register 22. The comparator 14 compares the count value S12 counted by the PWM counter 12 and a comparative reference value S23 form the switching device 23, and generates an active PWM signal Sp when the former value exceeds the latter value. The up/down identifying signal S12a is a signal indicating whether the PWM counter 12 is in action of up-count or down-count, and is generated by the PWM counter 12 and outputted to the count-state reading-out register 22. The count-state reading-out register 22 outputs the switching control signal S22 to the switching device 23 according to the up/down identifying signal S12a. The switching control signal S22 gives a command to select the output of the start point register 13a when the up/down identifying signal S12a indicates the up-count action, and gives a command to select the output of the end point register 13b when the up/down identifying signal S12a indicates the down-count action. The above-described output selection commands are only examples. Thus, it may be reversed. That is, when the up/down identifying signal S12a indicates the up-count action, it may give a command to select the output of the end point register 13b, and when the up/down identifying signal S12a indicates the down-count action, it may give a command to select the output of the start point register 13a.

Figure 10:
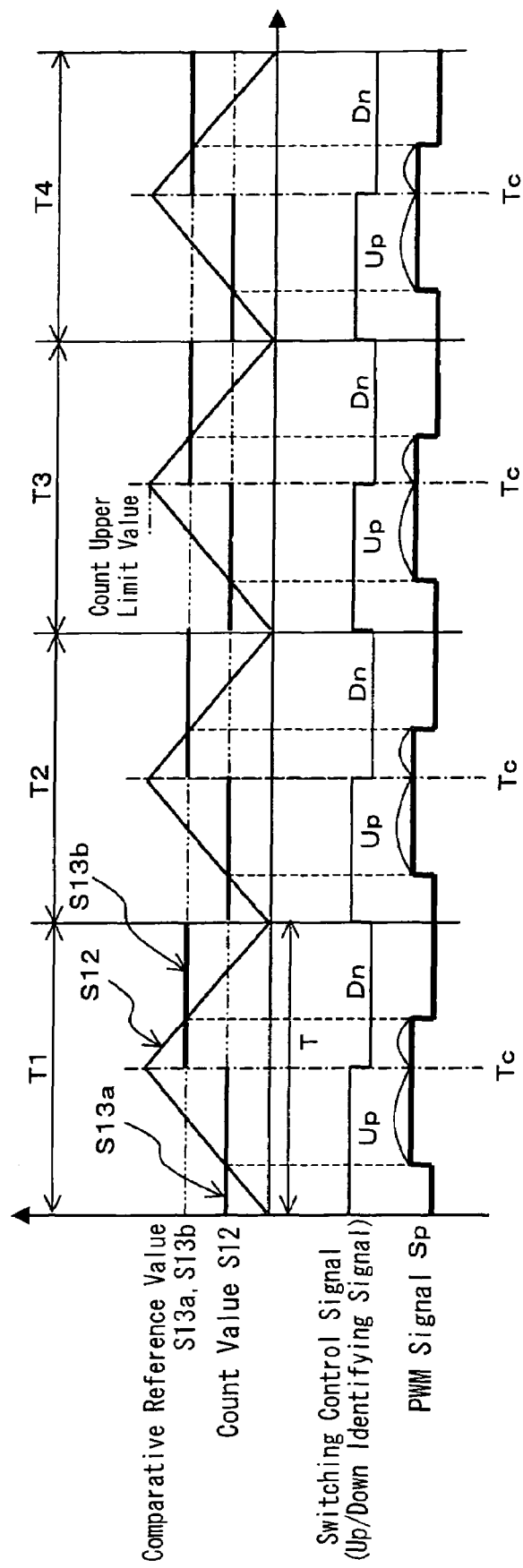
FIG. 10 is a timing chart for showing the action of the PWM circuit according to the fifth embodiment of the present invention.

FIG. 10 is a timing chart for showing the action of the PWM circuit 10d of this embodiment. The switching device 23 selects the output (start point setting value S13a) of the start point register 13a when the PWM counter 12 is in the up-count action according to the switching control signal S22 from the count-state reading-out register 22. The start point setting value S13a is set to be lower than the reference value. When the count value S12 counted by the PWM counter 12 exceeds the start point setting value S13a, the PWM signal Sp as the output of the comparator 14 rises.

Further, the switching device 23 selects the output (end point setting value S13b) of the end point register 13b when the PWM counter is in the down-count action according to the switching control signal S22. The end point setting value S13a is set to be higher than the reference value. When the count value S12 counted by the PWM counter 12 exceeds the end point setting value S13b, the PWM signal Sp as the output of the comparator 14 falls. Thereby, the phase of the PWM signal Sp comes relatively on a lead side with respect to the center Tc of the carrier period T.

Inversely, when the start point setting value S13a of the start point register S13 is set to be higher than the reference value and the end point setting value S13b of the end point register 13b is set lower than the reference value, the phase of the PWM signal Sp comes relatively on a delay side with respect to the center Tc of the carrier period T.

With this embodiment, the higher harmonic wave component contained in the sine wave signal generated based on the PWM signal Sp can be dispersed in a still wider range compared to the related art.

The reference value in the control action of this embodiment means the value which corresponds to the comparative reference value S13 of the first to fourth embodiments. Further, in any cases, by equalizing the amount of increase and the amount of decrease with respect to the reference value, the duty ratio of the PWM signal Sp becomes equal to the duty ratio of the reference as a result. The reference herein means the state where the reference value is maintained as it is without increasing/decreasing the start point setting value S13a and the end point setting value S13b.

Sixth Embodiment

Figure 11:
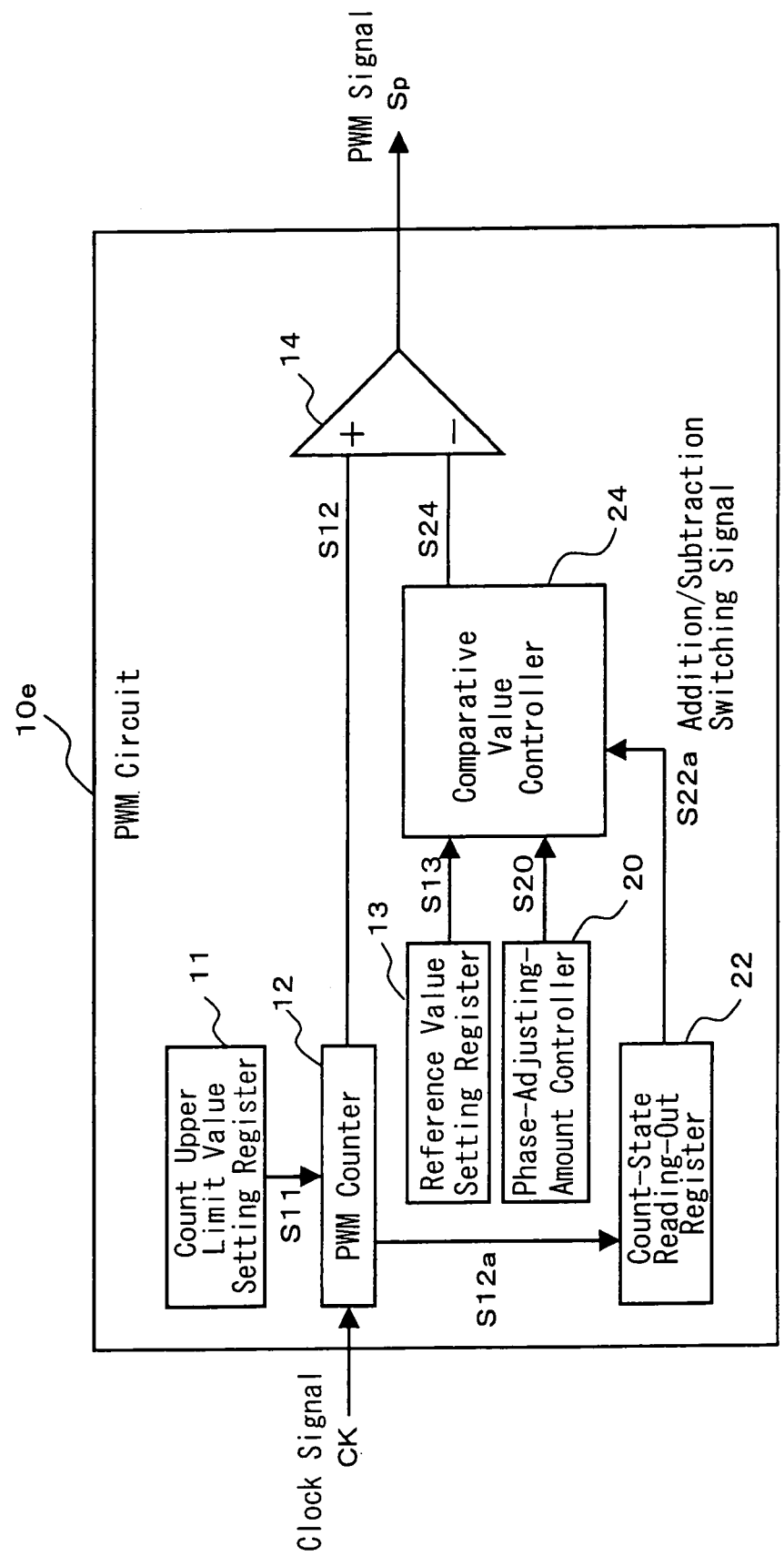
FIG. 11 is a block diagram for showing the structure of a PWM circuit according to a sixth embodiment of the present invention.

FIG. 11 is a block diagram for showing the structure of a PWM circuit 10e according to a sixth embodiment of the present invention.

In FIG. 11, the same reference numerals as those used in FIG. 9 of the fifth embodiment indicate the same structural elements. Thus, the detailed description thereof will be omitted. The start point register 13a, the end point register 13b, and the switching device 23 as the structural elements shown in FIG. 9 are omitted. Instead, a reference value setting register 13, a phase-adjusting-amount controller 20, and a comparative value controller 24 are added. The reference value setting register 13 sets the count upper limit value which determines the carrier period of the PWM. The phase-adjusting-amount controller 20 sets a phase adjusting amount S20. The phase adjusting amount S20 indicate the adjusting amount of the comparative reference value S13 for determining the detail. The phase-adjusting-amount controller 20 sets a plurality of the phase adjusting amounts S20 (two values in large and small numbers in the case of FIG. 13). These plural phase adjusting amounts S20 are repeatedly changed by synchronizing with the carrier period T. The count-state reading-out register 22 generates an addition/subtraction switching signal S22a based on the up/down identifying signal S12a outputted from the PWM counter 12 and outputs it to the comparative value controller 24. The addition/subtraction switching signal S22a switchably designates the adding processing and subtracting processing for the cases when the up/down identifying signal S12a indicates the up-count action and when the up/down identifying signal S12a indicates the down-count action.

The comparative value controller 24 generates a comparative reference value S24 based on the comparative reference value S13 of the reference value setting register 13, the phase adjusting amount S20 of the phase-adjusting-amount controller 20, and the addition/subtraction switching signal S22a from the count-state reading-out register 22 and outputs it to the comparator 14.

Figure 12:
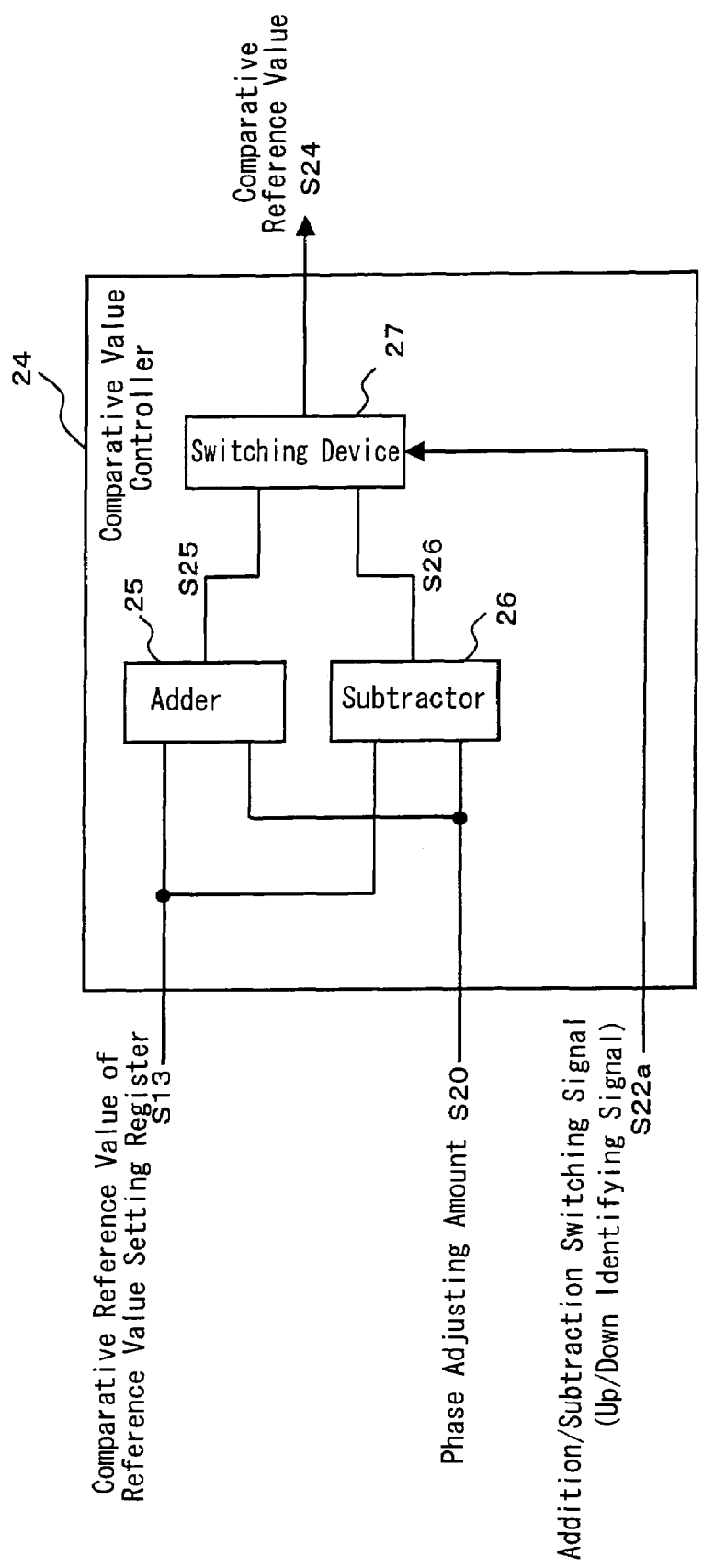
FIG. 12 is a block diagram for showing the structure of a comparative value controller according to the sixth embodiment of the present invention.

FIG. 12 is a block diagram for showing the detailed structure of the comparative value controller 24. The comparative value controller 24 comprises an adder 25, a subtractor 26, and a switching device 27.

The adder 25 adds the phase adjusting amount S20 of the phase-adjusting-amount controller 20 to the comparative reference value S13 set in the reference value setting register 13. The subtractor 26 subtracts the phase adjusting amount S20 from the comparative reference value S13. The switching device 27 switches an added result S25 and a subtracted result S26 by every carrier period T according to the addition/subtraction switching signal S22a from the count-state reading-out register 22.

Figure 13:
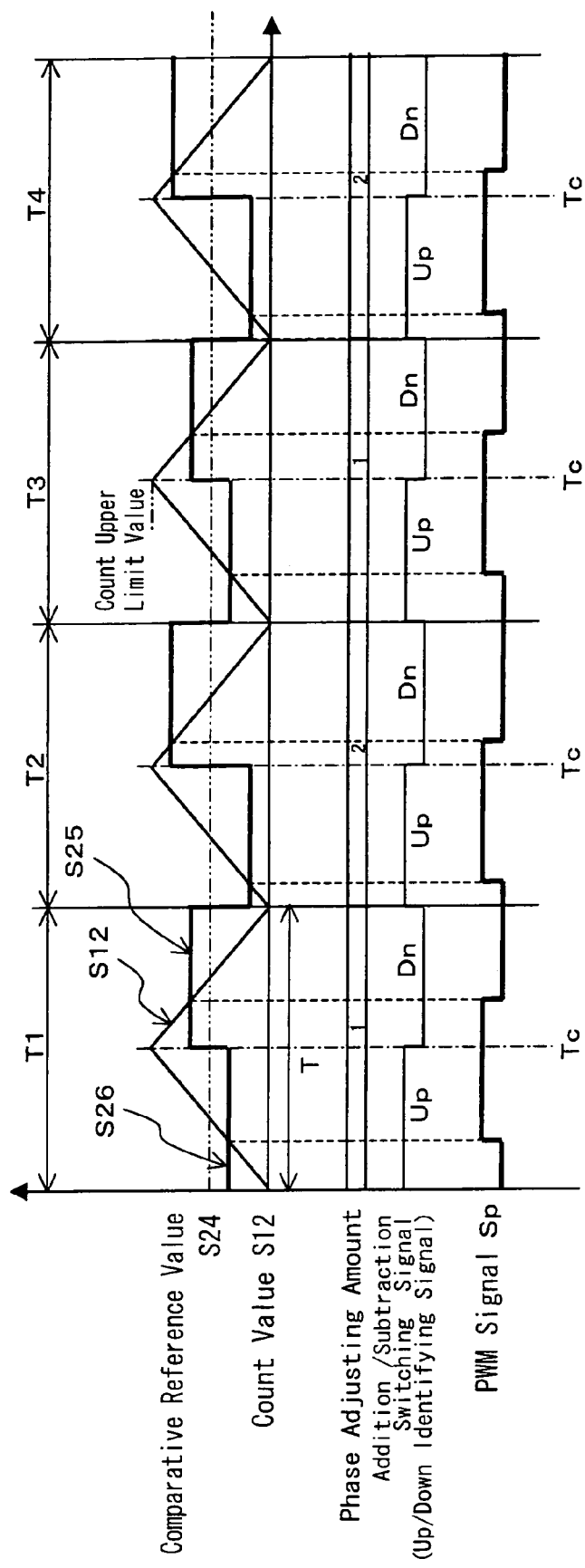
FIG. 13 is a timing chart for showing the action of the PWM circuit according to the sixth embodiment of the present invention.

FIG. 13 is a timing chart for showing the action of a PWM circuit 10e of this embodiment. In the first period T1, the phase-adjusting-amount controller 20 sets the phase adjusting amount S20 relatively small.

When the PWM counter 12 is in the up-count action, the switching device 27 selects the subtracted result S26 of the subtractor 26. The subtracted result S26 is obtained by subtracting the phase adjusting amount S20 from the comparative reference value S13 which is set by the reference value setting register 13. The subtracted result S26 becomes the value lower (smaller) than the comparative reference value S13. When the count value S12 counted by the PWM counter 12 exceeds the subtracted result S26, the PWM signal Sp as the output of the comparator 14 rises.

Further, when the PWM counter 12 is in the down-count action in the first period T1, the switching device 27 selects the added result S25 of the adder 25. The added result S25 is obtained by adding the phase adjusting amount S20 to the comparative reference value S13 which is set by the reference value setting register 13. The added result S25 becomes the value higher (larger) than the comparative reference value S13. When the count value S12 outputted from the PWM counter 12 exceeds the added result S25, the PWM signal Sp as the output of the comparator 14 falls. Thereby, the PWM signal Sp in the first period T1 comes in the state where the phase comes relatively on a lead side with respect to the center Tc of the carrier period T.

In the second period T2, the phase-adjusting-amount controller 20 changes the phase adjusting amount S20 to be larger than the phase adjusting amount S20 of the first period T1. Thereby, the phase adjusting amount S20 when the PWM counter 12 is in the up-count action becomes larger in the second period T than in the first period T1. Thus, the subtracted result S26 which is selected and outputted by the switching device 27 in the second period T2 becomes the value lower (smaller) than that of the subtracted result S26 which is selected and outputted by the switching device 27 in the first period T1.

When the count value S12 counted by the PWM counter 12 in the second period T2 exceeds the subtracted result S26, the PWM signal Sp as the output of the comparator 14 rises. The rise timing becomes earlier than the rise timing in the first period T1.

Further, the switching device 27 selects the added result S25 of the adder 25 when the PWM counter 12 in the second period T2 is in the down-count action. The added result S25 becomes the value higher (larger) than the added result S25 which is selected and outputted by the switching device 27 in the first period T1. When the count value S12 outputted from the PWM counter 12 exceeds the added result S25, the PWM signal Sp as the output of the comparator 14 falls. The fall timing becomes earlier than that of the first period T1.

Thereby, the PWM signal Sp in the second period T2 comes in the state where the phase comes on a lead side with respect to the center Tc of the carrier period T to a larger extent compared to the case of the first period T1.

The third period T3 is the same as the case of the first period T1, and the fourth period T4 is the same as the case of the second period T2.

With this embodiment as described above, it is possible to disperse the higher harmonic wave component contained in the sine wave signal generated from the PWM signal Sp by changing the comparative reference value for the count value S12 of the PWM counter 12 in the up-count action and the down-count action. What is more, there requires only one reference value setting register to be used, thereby imposing no load on the software.

Seventh Embodiment

Figure 14:
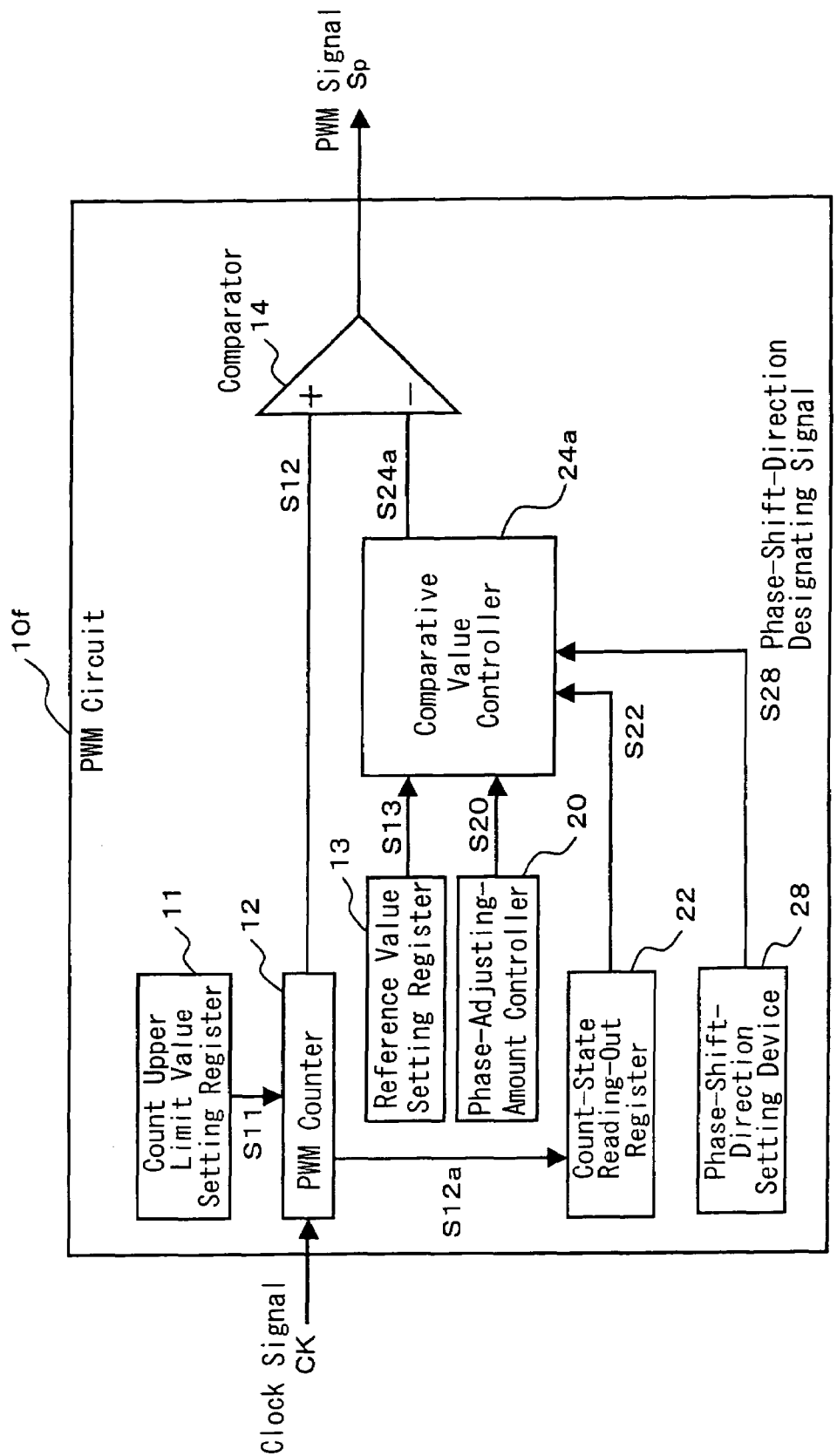
FIG. 14 is a block diagram for showing the structure of a PWM circuit according to a seventh embodiment of the present invention.

FIG. 14 is a block diagram for showing the structure of a PWM circuit 10f according to a seventh embodiment of the present invention.

In FIG. 14, the same reference numerals as those used in FIG. 11 of the sixth embodiment indicate the same structural elements. Thus, the detailed description thereof will be omitted. In this embodiment, a phase-shift-direction setting device 28 is provided in addition to the structural elements shown in FIG. 11. The phase-shift-direction setting device 28 can set the directions of the phase shift of the PWM signal Sp in both on the lead side (plus side) and the delay side (minus side) with respect to the center Tc of the carrier period T. A phase-shift-direction designating signal S28 outputted from the phase-shift-direction setting device 28 is inputted to a comparative value controller 24a.

Figure 15:
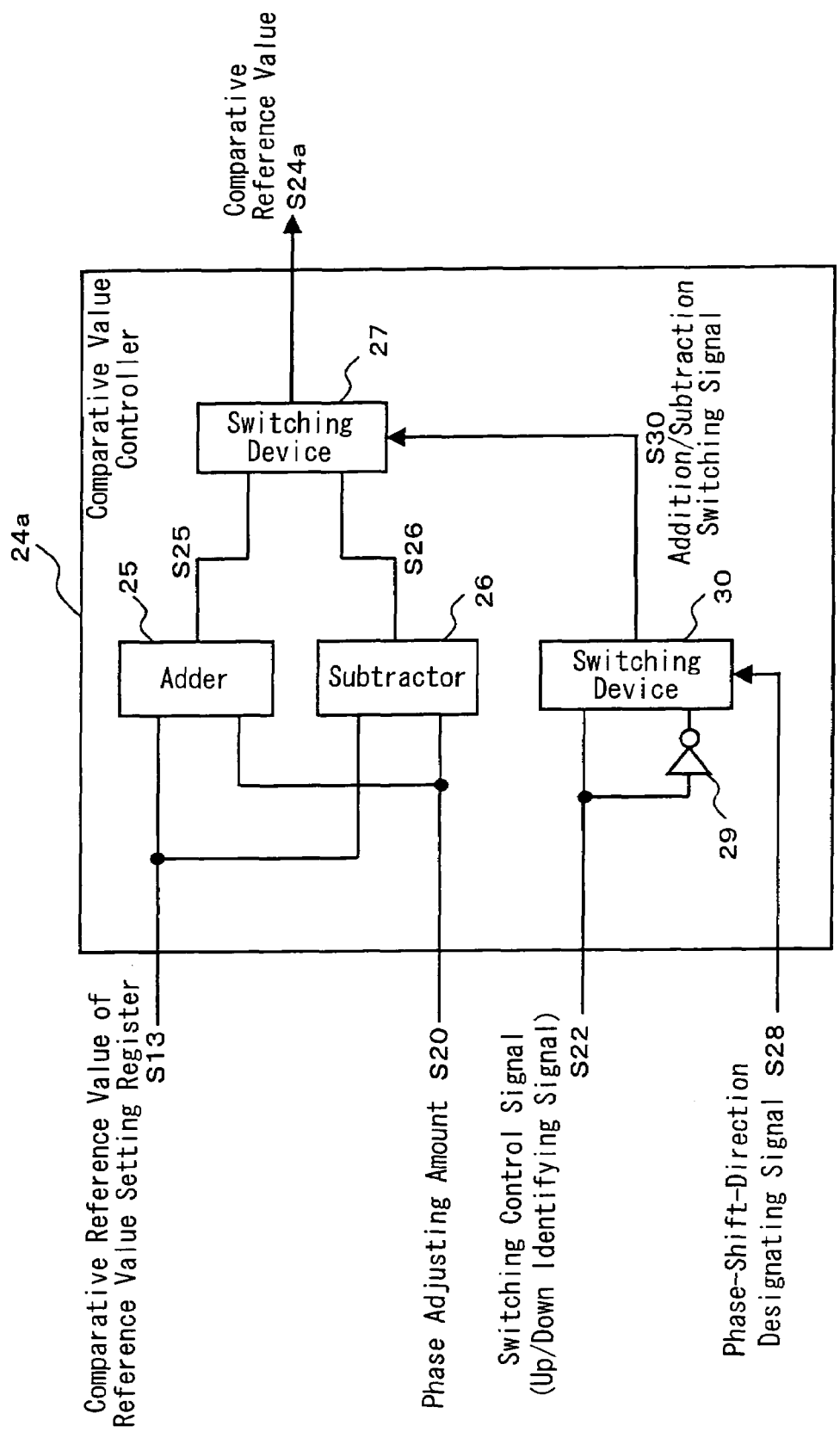
FIG. 15 is a block diagram for showing the structure of a comparative value controller according to the seventh embodiment of the present invention.

FIG. 15 is a block diagram for showing the detailed structure of the comparative value controller 24a. The comparative value controller 24a comprises an adder 25, a subtractor 26, and a switching device 27, which are the same as those of the sixth embodiment. Further, the comparative value controller 24a comprises an inverter 29 and a switching device 30. The inverter 29 generates an inverted logic of the count-state reading-out register 22. The switching device 30 switches the switching control signal S22 of the count-state reading-out register 22 and the inverted logic S29 according to the phase-shift-direction designating signal S28 from the phase-shift direction setting device 28.

The adder 25 outputs an added result S25 by adding the output (comparative reference value S13) of the reference value setting register 13 and the output (phase adjusting amount S20) of the phase-adjusting-amount controller 20. The subtractor 26 outputs a subtracted result S26 by subtracting the output (phase adjusting amount S20) of the phase-adjusting-amount controller 20 from the output (comparative reverence value S13) of the reference value setting register 13. The switching device 27 switches and outputs the output (added result S25) of the adder 25 and the output (subtracted result S26) of the subtractor 26. A comparative reference value S24a is constituted with the added result S25 and the subtracted result S26 which are switchably outputted by the switching device 27. The comparative reference value S24a is outputted to the comparator 14. The output switching action of the switching device 27 is controlled according to an addition/subtraction switching signal S30 outputted from the switching device 30. The switching device 30 generates the addition/subtraction switching signal S30 by switchably outputting the output (switching control signal S22) of the count-state reading-out register 22 and the output (inverted output of switching control signal S22) from the inverter 29 based on the output (phase-shift-direction designating signal S28) of the phase-shift-direction setting device 28.

Figure 16:
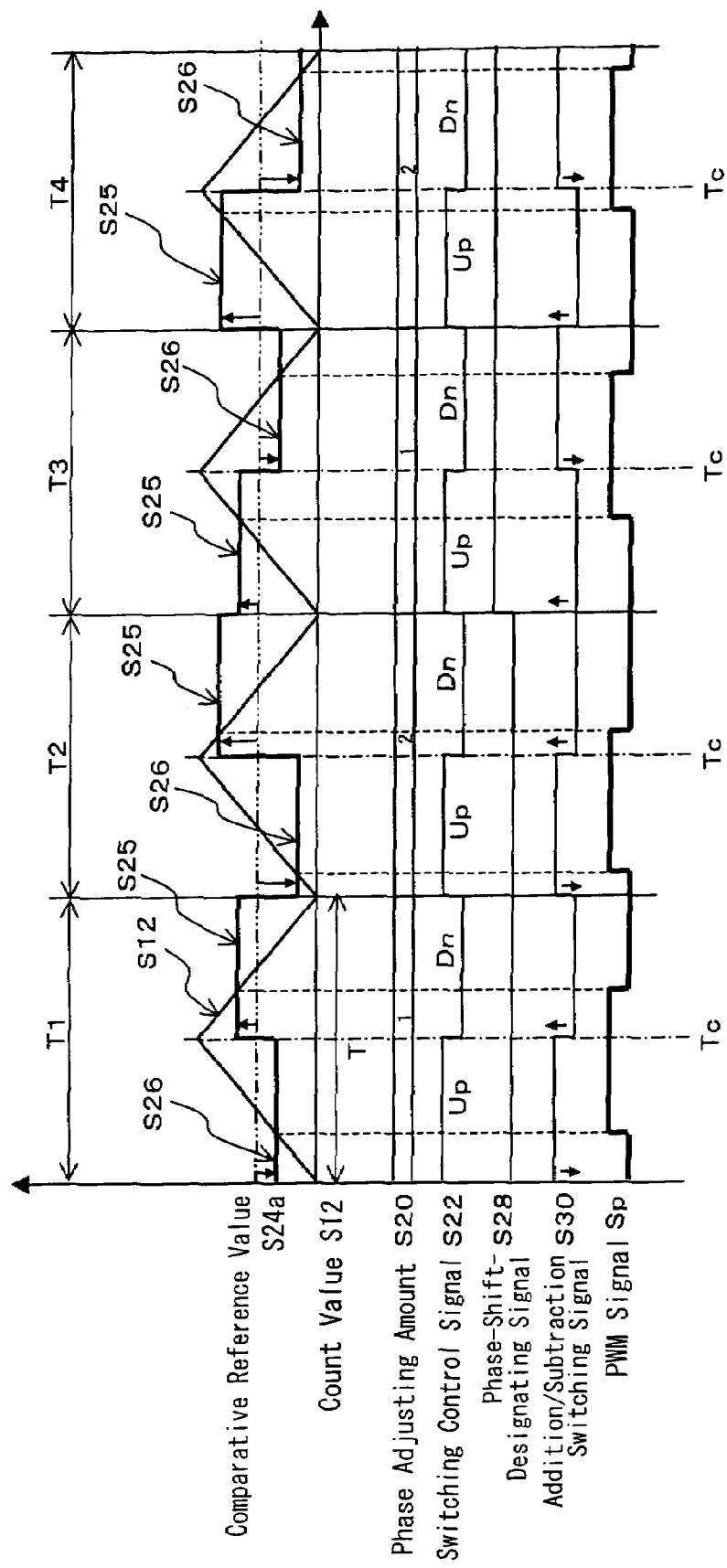
FIG. 16 is a timing chart for showing the action of the PWM circuit according to the seventh embodiment of the present invention.

FIG. 16 is a timing chart for showing the action of a PWM circuit 10f of this embodiment. Here, description is provided on assumption that the phase-shift-direction designating signal S28 is set in a period in which the "L" level and "H" level are inversed by every double-period (2T) which is twice the carrier period T.

In the first and the second periods T1, T2, the phase-shift-direction designating signal S28 outputted from the phase-shift-direction setting device 28 becomes the "L" level. Thus, the switching device 30 outputs the switching control signal S22 which is the output of the count-state reading-out register 22 in the state as it is to the switching device 27 as the addition/subtraction switching signal S30. Therefore, the switching device 27 outputs the subtracted result S26 to the comparator 14 as the comparative reference value S24a in the first half of the carrier period T, and outputs the added result S25 to the comparator 14 as the comparative reference value S24a in the latter half. The result is the same as the case of the sixth embodiment. That is, in the first period T1, the phase of the PWM signal Sp is on a lead side with respect to the center Tc of the carrier period T, and the phase is on a lead side in the second period T2 to a larger extent compared to the state in the first period T1.

In the third and the fourth periods T3, T4, the phase-shift-direction designating signal S28 is inverted to be the "H" level. Thus, the switching device 30 outputs the output of the inverter 29 to the switching device 27 as the addition/subtraction switching signal S30. Therefore, inversely from the above-described control form, the switching device 27 outputs the added result S25 to the comparator 14 as the comparative reference value S24a in the first half of the carrier period T, and outputs the subtracted result S26 to the comparator 14 as the comparative reference value S24a in the latter half. Thus, the phase of the PWM signal Sp is on a delay side with respect to the center Tc of the carrier period T in the third period T3, and the phase is on a delay side in the fourth period T4 to a larger extent compared to the state in the third period T3.

With this embodiment as described above, not only the shift amount with respect to the center Tc of the carrier period T but also the shift direction of the effective pulse period of the PWM signal Sp can be controlled. Thus, the higher harmonic wave signal contained in the sine wave signal generated from the PWM signal Sp can be dispersed in a still wider range than the case of the sixth embodiment.

Eighth Embodiment

Figure 17:
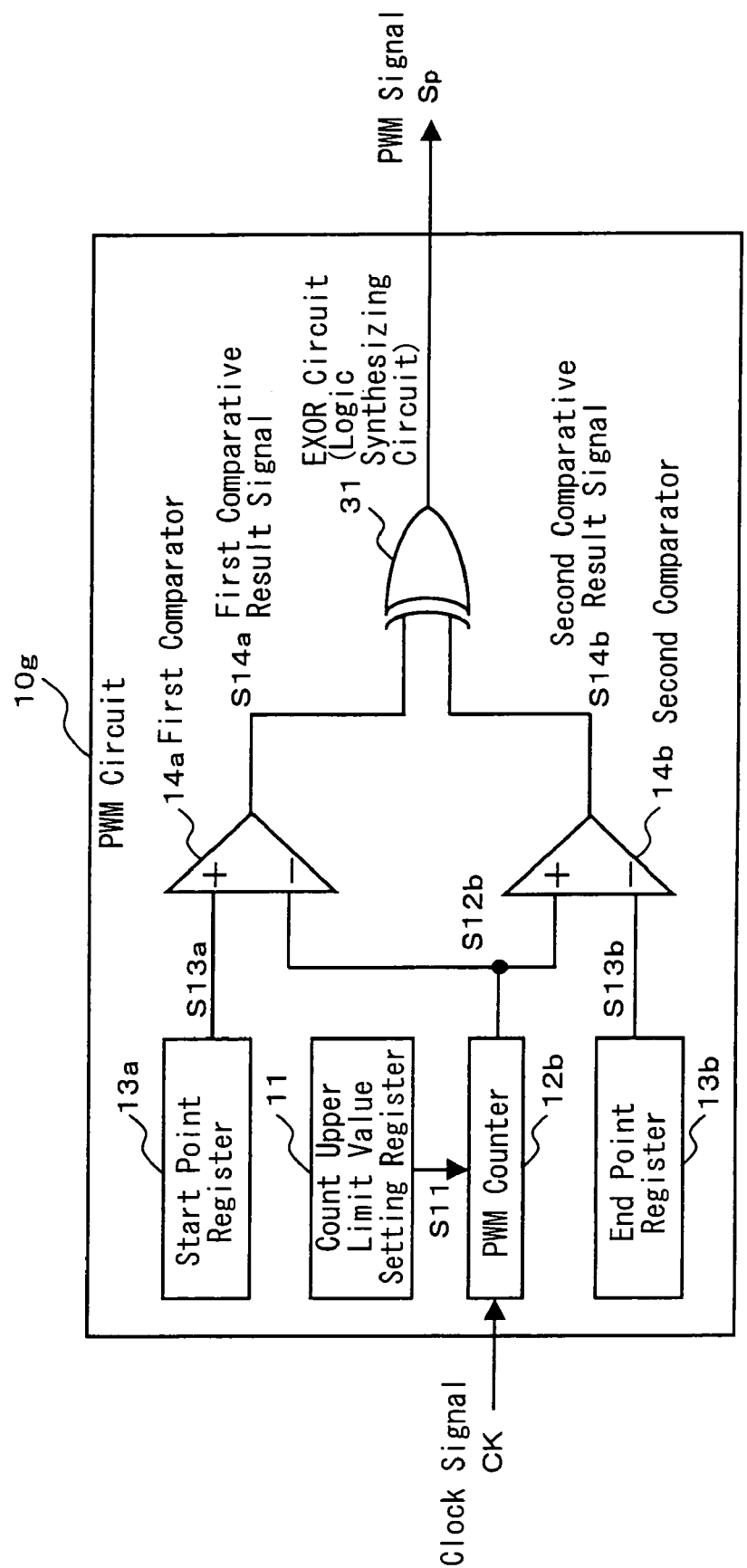
FIG. 17 is a block diagram for showing the structure of a PWM circuit according to an eighth embodiment of the present invention.

FIG. 17 is a block diagram for showing the structure of a PWM circuit 10g according to an eighth embodiment of the present invention.

The PWM circuit 10g comprises a count upper limit value setting register 11, a PWM counter 12b, a start point register 13a, an end point register 13b, a first comparator 14a, a second comparator 14b, and an EXOR circuit (logic synthesizing circuit) 31.

The PWM counter 12b performs up-count of the clock signals CK. The start point register 13a sets the start point setting value of the effective pulse period of the PWM signal Sp. The end point register 13b sets the end point setting value of the effective pulse period. The first comparator 14a compares a count value S12b counted by the PWM counter 12b and a start point setting value S13a of the start point register 13a, and generates an active comparative result signal 14a when the former value exceeds the later value. The second comparator 14b compares the count value S12b counted by the PWM counter 12b and the end point setting value S13b of the end point register 13b, and generates an active comparative result signal 14b when the former value exceeds the later value. The EXOR circuit 31 finds an exclusive OR of the two comparative result signals S14a, S14b and outputs it as the PWM signal Sp. The PWM counter 12b is a counter which performs only the up-count action but not the down-count action.

Figure 18:
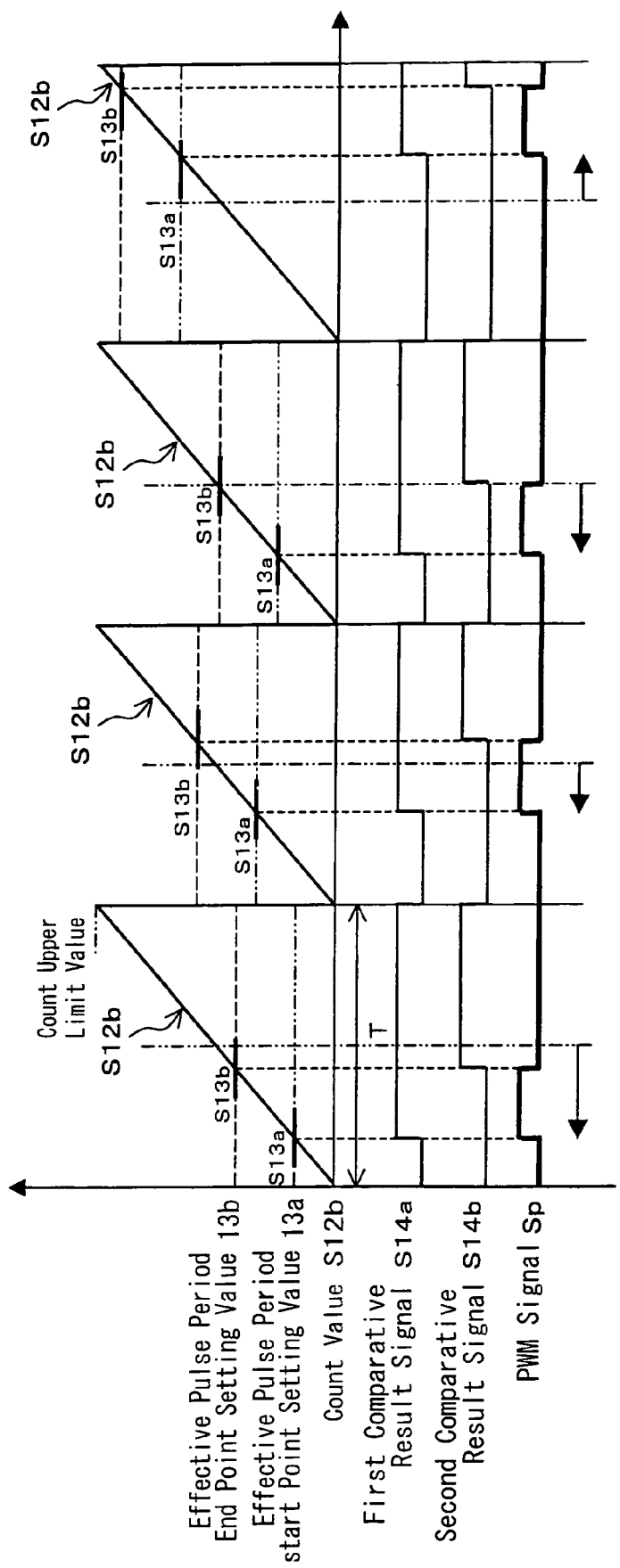
FIG. 18 is a timing chart of the PWM circuit according to the seventh embodiment of the present invention.

FIG. 18 is a timing chart for showing the action of the PWM circuit 10g of this embodiment. The EXOR circuit 31 outputs the PWM signal Sp to be in the "H" level when the logic of the first comparative result signal S14a and that of the second comparative result signal S14b are different from each other (here, when the first comparative result signal S14a is the "H" level and the second comparative result signal S14b is the "L" level). By adjusting the start point setting value S13a and the endpoint setting value S13b, the rise timing and fall timing of the PWM signal Sp can be varied. The start point setting value S13a as the output of the start point register 13a can be adjusted by the start point register 13a. Similarly, the end point setting value S13b as the output of the end point register 13b can be adjusted by the end point register 13b.

Thereby, the higher harmonic wave signal contained in the sine wave signal generated from the PWM signal Sp can be dispersed in a still wider range.

Ninth Embodiment

Figure 19:
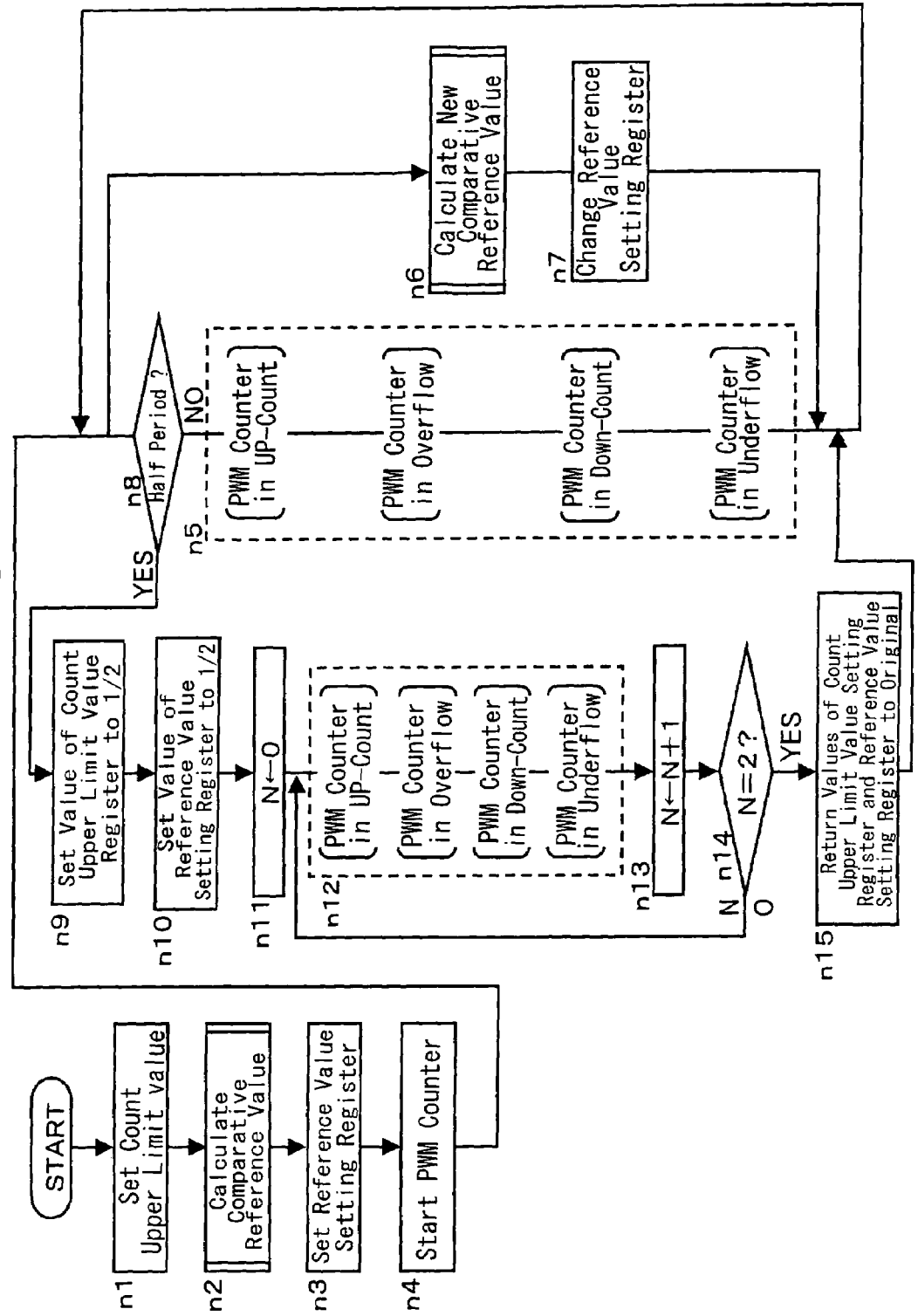
FIG. 19 is a flowchart of software according to a ninth embodiment of the present invention.
Figure 20:
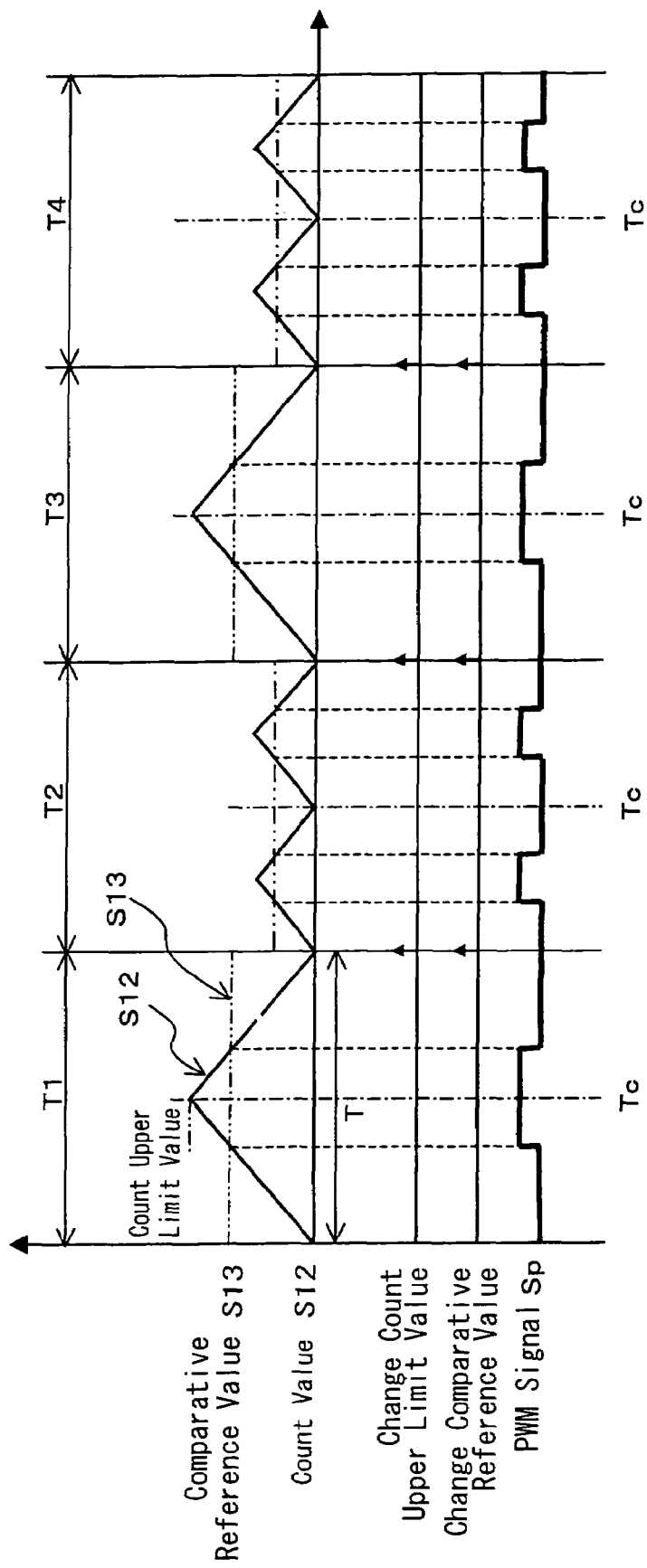
FIG. 20 is a timing chart for showing the action of the software according to the ninth embodiment of the present invention.

FIG. 19 is a flowchart for showing the structure of software which executes the control of a PWM circuit according to a ninth embodiment of the present invention. FIG. 20 is a timing chart for showing the action of the PWM circuit of this embodiment. The circuit structure which embodies this embodiment is the same as the structure shown in FIG. 25 so that the description thereof will be omitted.

In FIG. 19, a step n8 judges whether or not it is currently in the ½ period of the carrier period T. The judgment in the step n8 is "NO" at the timing immediately after starting the control (T=0·T) and at the timing of the end of the period (T=n·T (n is a natural number)). Thus, it proceeds to a step n5. The processing in the step n5 is the same processing of the step n5 which is described by referring to FIG. 28. Thus, the description thereof will be omitted here. The judgment of the step n8 in the half-period timing (T=½n−T (n is a natural number)) is "YES". Thus, it proceeds to a step n9. In the step n9, the count upper limit value setting register 11 sets the count upper limit value S11 to be the ½ value (a half value of the upper limit value) of the original count upper limit value S11. Then, in a step n10, the reference value setting register 13 sets the comparative reference value S13 to be a ½ value (a half value of the comparative reference value). Subsequently, in a step n11, a variable N is set to be "0" and the up/down cont action of the PWM counter 12 is repeated twice while keeping the same set value. Specifically, the variable N is incremented in a step n13, and it is judged in a step n14 whether or not the variable N has reached "2". If it has not reached "2", the up/down count action of the PWM counter 12 is repeated in the same set value. When the up/down count action of the PWM counter 12 is repeated twice, it proceeds to a step n15 in which the count upper limit value S11 of the count upper limit value setting register 11 is returned to the original value. In the same manner, the comparative reference value S13 of the reference value setting register 13 is returned to the original value.

By the action as described above, two pulses of the PWM signal Sp with ½ of the original width are generated within one carrier period. However, there is no change in the duty ratio within one carrier period.

With this embodiment as described above, it is possible to shift the timing of generating the pulses of the PWM signal Sp without changing the duty ratio within the carrier period T. Thus, the higher harmonic wave component contained in the sine wave signal generated from the PWM signal Sp can be dispersed.

Tenth Embodiment

FIG. 21 is a block diagram for showing the structure of a PWM circuit 10h according to a tenth embodiment of the present invention.

This PWM circuit 10h comprises a count upper limit value setting register 11, a PWM counter 12, a reference value setting register 13, and a comparator 14. Further, the PWM circuit 10h comprises 1-bit-right-shift circuits 32, 33, a first and second switching devices 34, 35, and a carrier period controller 36.

The 1-bit-right-shift circuit 32 generates and outputs a half count upper limit value S32 which is a half of the count upper limit value S11 through shifting the count upper limit value S11 of the count upper limit value setting register 11 to the right by 1 bit. The first switching device 34 selects and outputs either the count upper limit value S11 or the half count upper limit value S32 according to a double-speed command signal S36 which is supplied from the carrier period controller 36.

The 1-bit-right-shift circuit 33 generates and outputs a half comparative reference value S33 which is a half of the comparative reference value S13 through shifting the comparative reference value S13 of the reference value setting register 13 to the right by 1 bit. The second switching device 35 selects and outputs either the comparative reference value S13 or the half comparative reference value S33 according to the double-speed command signal S36 which is supplied from the carrier period controller 36. The carrier period controller 36 outputs the double-speed command signal S36. The double-speed command signal S36 has such a signal form which switchably gives a command of double speed or non-double-speed.

In this embodiment, it is possible to variably adjust the count upper limit value without changing the structure of the count upper limit value setting register 11. Further, it is possible to variably adjust the comparative reference value S13 without changing the structure of the reference value setting register 13.

Figure 22:
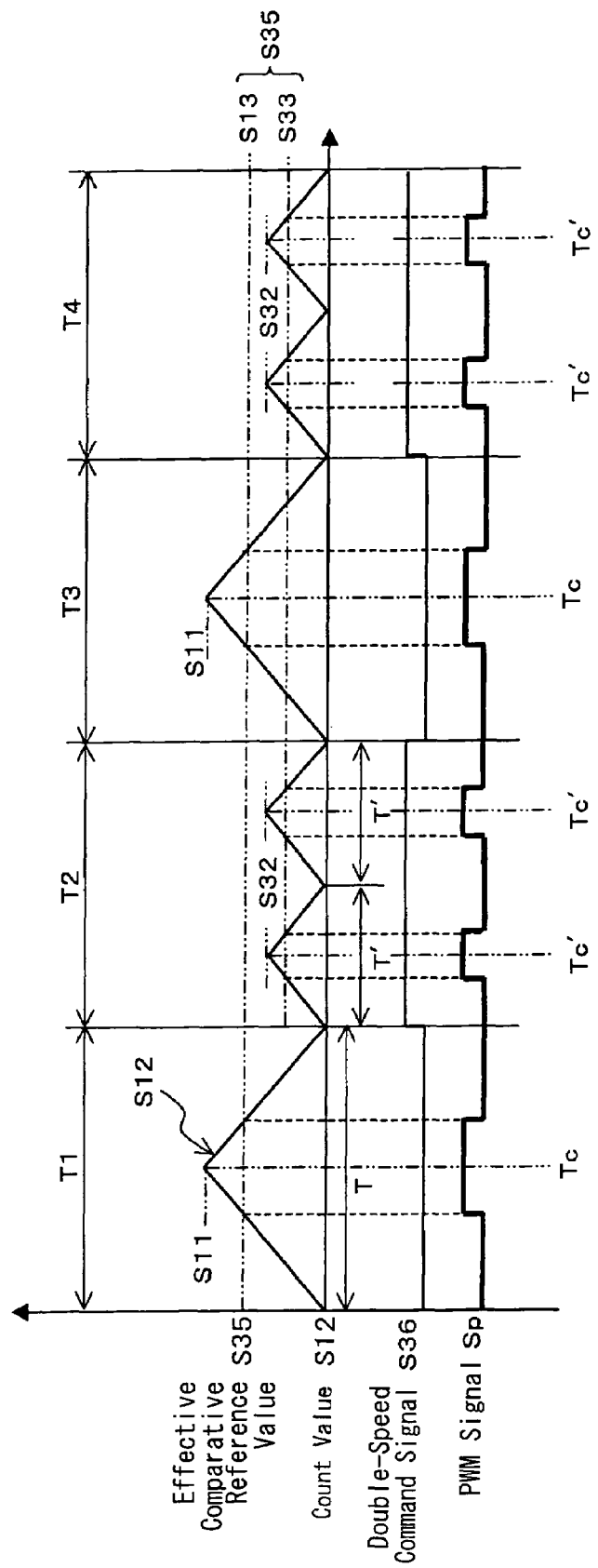
FIG. 22 is a timing chart for showing the action of the PWM circuit according to the tenth embodiment of the present invention.

FIG. 22 is a timing chart for showing the action of the PWM circuit 10h of this embodiment. The description provided below by referring to FIG. 22 is presented on assumption that the double-speed command signal S36 has such a signal form in which the signal level is inverted by ever carrier period.

In the first period T1, the double-speed command signal S36 outputted from the carrier period controller 36 is in an inactive "L" level. In that state, the first switching device 34 supplies the count upper limit value S11 to the PWM counter 12 as an effective upper limit value S34. Further, the second switching device 35 supplies the comparative reference value S13 to the comparator 14 as an effective comparative reference value S35. Thus, the PWM counter 12 performs the up/down count in a large mountain-like waveform. The PWM signal Sp outputted from the comparator 14 is in a waveform which is symmetrical with respect to the center Tc of the carrier period T.

In the second period T2, the double-speed command signal S36 of the carrier period controller 36 is in an active "H" level. In that state, the first switching device 34 supplies the half count upper limit value S32 outputted from the 1-bit-right-shift circuit 32 to the PWM counter 12 as the effective upper limit value S34. Further, the second switching device 35 supplies the half comparative reference value S33 outputted from the 1-bit-right-shift circuit 33 to the comparator 14 as the effective comparative reference value S35. Thus, the PWM counter 12 performs the up/down count in a small mountain-like waveform. The PWM signal Sp outputted from the comparator 14 is in a waveform which is symmetrical with respect to the center Tc' of the half carrier period T'. These become two pulses within the reference carrier period, which are largely shifted from the center Tc of the carrier period T.

With this embodiment as described above, it is possible to shift the timing of generating the pulses of the PWM signal Sp without changing the duty ratio within the carrier period Sp. Thus, it enables to increase the extent of dispersing the higher harmonic wave component contained in the sine wave signal which is generated based on the PWM signal Sp.

Eleventh Embodiment

With the structure of the above-described tenth embodiment, in the case where the PWM circuit notifies overflow interruption or underflow interruption to the CPU when the PWM counter 12 is in the state of overflow or underflow, the timing of overflow or underflow is shifted from the regular timing if the double-speed command signal S36 is set active. Thus, it is necessary to specifically adjust the interruption processing in software by providing the structure (carrier period controller) for adjusting the carrier period T. Such adjustment of the interruption processing is achieved in the eleventh embodiment.

Figure 23:
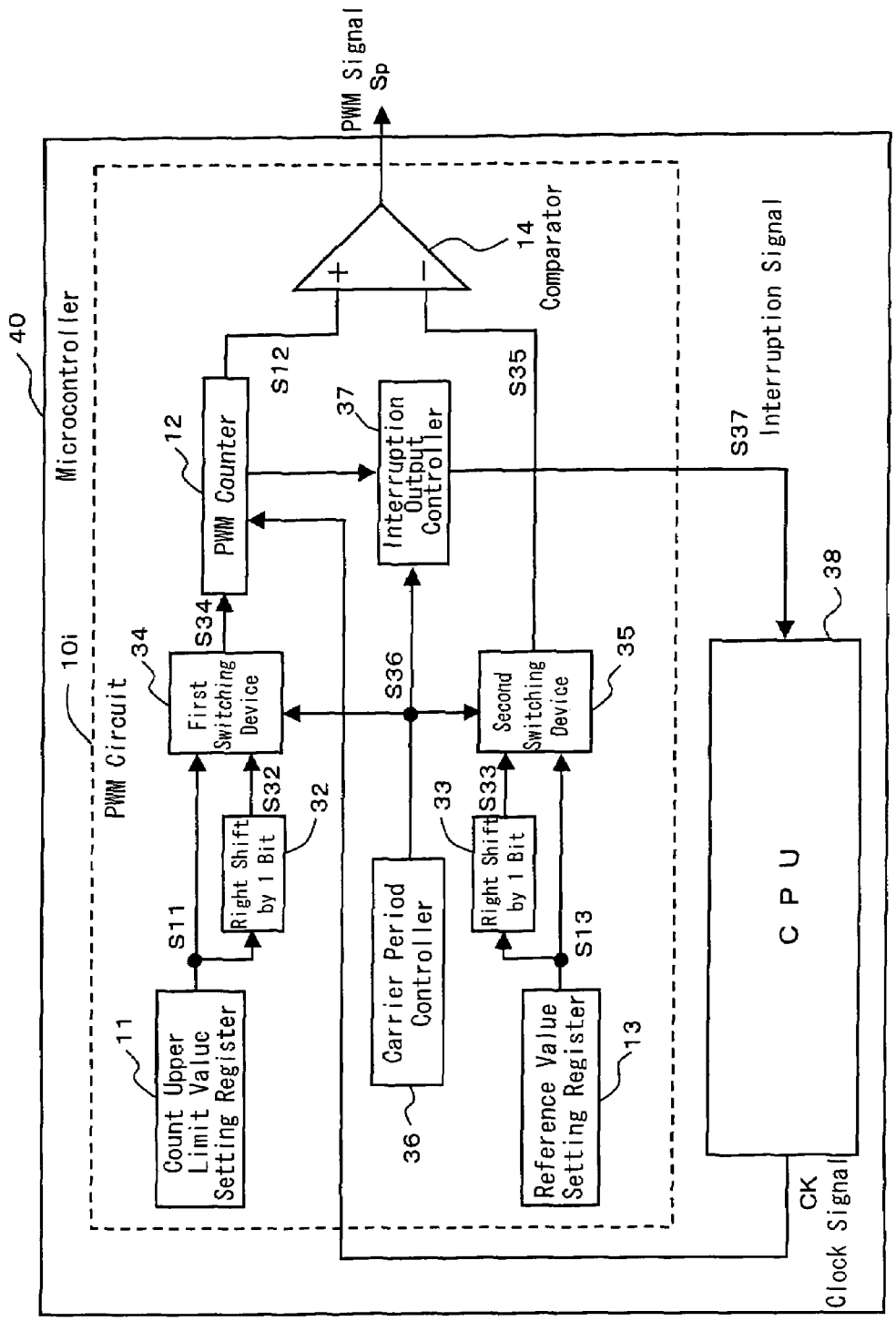
FIG. 23 is a block diagram for showing the structure of a microcontroller according to an eleventh embodiment of the present invention.

FIG. 23 is a block diagram for showing the structure of a microcontroller 40 according to an eleventh embodiment of the present invention.

The microcontroller 40 comprises a CPU 38 and a PWM circuit 10i which is obtained by adding an interruption output controller 37 to the PWM circuit 10h of the tenth embodiment. The interruption output controller 37 detects the underflow interruption and the overflow interruption caused by the overflow or underflow of the PWM counter 12 and outputs an interruption signal S37 to the CPU 38. Even when the count upper limit value of the PWM counter 12 is changed by the carrier period controller 36, the interruption output controller 37 generates the interruption signal S37 at the same timing as that of the case with no change in the count upper limit value.

Figure 24:
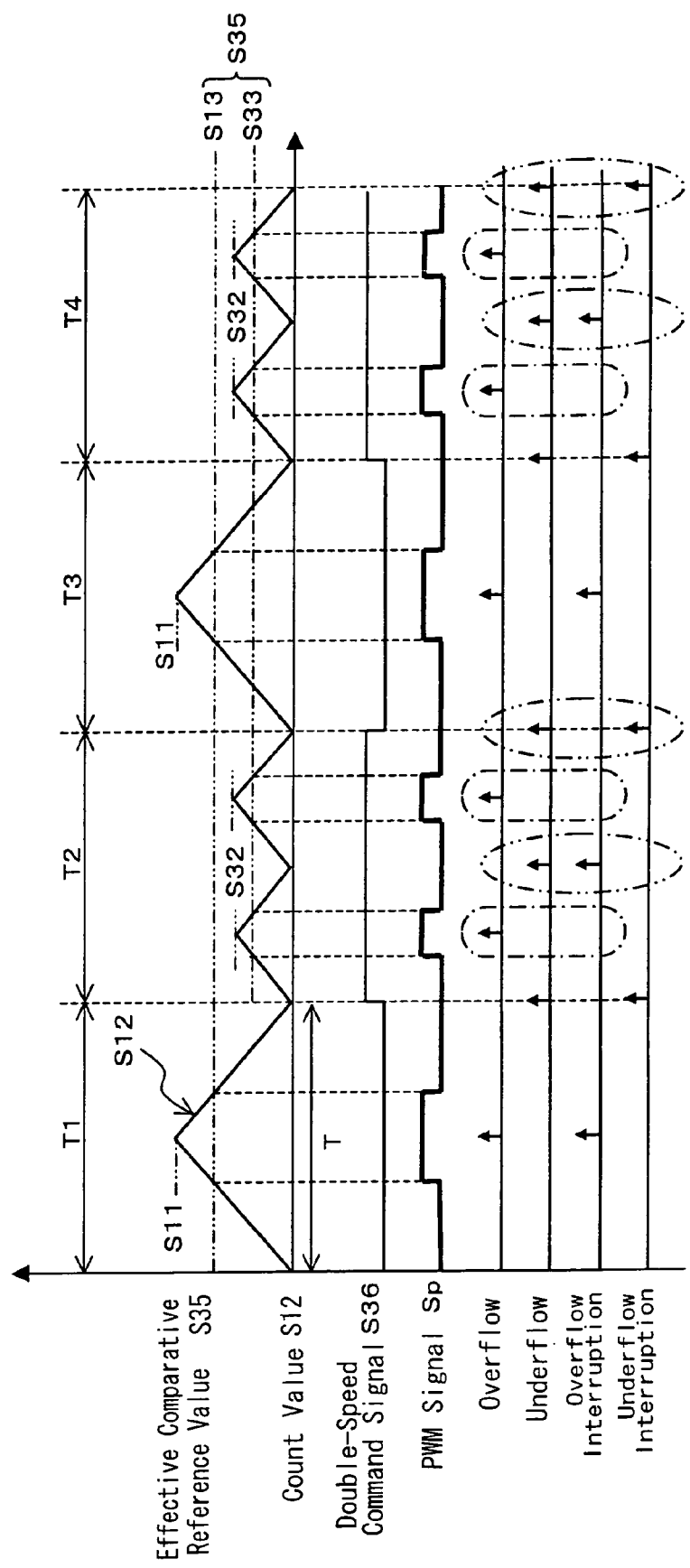
FIG. 24 is a timing chart for showing the action of a PWM circuit according to the eleventh embodiment of the present invention.

FIG. 24 is a timing chart for showing the action of the PWM circuit 10i of this embodiment.

As shown in FIG. 24, in the first period T1, T3, - - - (consecutive period T, the period of multiples of odd-numbers in - - - ) of the carrier period T, the double-speed command signal S36 of the carrier period controller 36 becomes the "L" level. In the second period T2, T4, - - - (consecutive period T, the period of multiples of even-numbers in - - - ), the double-speed command signal S36 of the carrier period controller 36 becomes the "H" level.

The interruption output controller 37 judges whether the carrier period T is the first period or the second period by judging the level of the double-speed command signal S36. Upon recognizing the first period T1, T3, - - - , the interruption output controller 37 outputs an interruption signal indicating the overflow to the CPU 38 as the interruption signal S37 when the PWM counter 12 overflows in this period. When the PWM counter 12 underflows, the interruption output controller 37 outputs an interruption signal indicating the underflow as the interruption signal S37 as well.

In the meantime, the interruption output controller 37 recognizing the second period T2, T4, - - - does not output the interruption signal 37 to the CPU 38 when the PWM counter 12 overflows in this period. Further, when the PWM counter 12 underflows in this period, the interruption output controller 37 outputs an inverted overflow interruption signal S37 as the interruption signal S37 if it is the first underflow from the start point of the second period T2, T4, - - - . Similarly, the interruption output controller 37 outputs the underflow interruption signal S37 as the interruption signal S37 if it is the second underflow from the start point of the second period T2, T4, - - - .

With this embodiment as described above, it is possible to set the interrupting processing in the software without minding the action of the carrier period controller 36.

The PWM circuit of the present invention is effective for the motor under the inverter control and, specifically, in reducing the noise of home electrical appliances such as air conditioners, washing machines, refrigerators, etc.

The present invention has been described by referring to the preferred embodiments. However, it is not intended to be limited to the embodiments but various combinations and modifications are possible without departing from the sprit and the broad scope of the appended claims.

What is claimed is:

1. A PWM circuit, comprising
a PWM counter for counting a clock signal,
a reference value setting register which sets a comparative reference value for determining a duty ratio of a PWM signal,
a comparator which generates said PWM signal from a comparative result of said comparative reference value and a count value of said PWM counter,
a delay device for delaying said PWM signal,
a switching device which switches and outputs an output of said comparator and an output of said delay device in order of time sequence, and
a delay time controller for setting delay time values which are different from each other in said delay device in accordance with said time sequence,
wherein said delay time controller comprises a random-number generating circuit for generating said delay time values as a random-number, said delay time controller setting said delay time values set by said random-number generating circuit in said delay device.

2. A PWM circuit, comprising
a PWM counter for performing up/down count of a clock signal,
a reference value setting register which sets a comparative reference value for determining a duty ratio of a PWM signal,
a phase-adjusting-amount controller which sets a phase adjusting amount of said PWM signal by a carrier period unit,
a comparative value controller for controlling said comparative reference value, and
a comparator which generates said PWM signal from a comparative result of said comparative reference value controlled by said comparative value controller and a count value of said PWM counter, wherein:
said comparative value controller comprises:
an adder for performing add-processing of a first phase adjusting amount to said comparative reference value,
a subtractor for performing subtract-processing of a second phase adjusting amount from said comparative reference value, and
a switching device which switchably outputs an output of said adder and an output of said subtractor according to a position of said PWM counter either for up- or down-count;
said comparator generates said PWM signal based on a comparative result of said count value of said PWM counter and an output of said switching device,
wherein said comparative value controller further comprises a phase shift direction setting device which sets a phase shift direction of said PWM signal; and
said switching device further controls switching of an output of said adder and an output of said subtractor according to a phase shift direction which is set by said phase shift direction setting device.

3. A PWM circuit, comprising
a carrier period controller which switchably sets a carrier period of a PWM signal and a double-speed of said carrier period by a carrier period unit,
an upper limit value setting device which sets a count upper limit of said PWM signal in said carrier period by synchronizing with a set cycle of said carrier period and sets a half count upper limit value in said double-speed period by synchronizing with a set cycle of said double-speed period,
a PWM counter for performing up/down count of a clock signal until reaching a set value of said upper limit value setting device,
a comparative reference value setting device which sets a comparative reference value for determining a duty ratio of said PWM signal in said carrier period by synchronizing with said set cycle of said carrier period and sets a half comparative reference value for determining a duty ratio of said PWM signal in said double-speed period by synchronizing with said set cycle of said double-speed period,
a comparator which generates said PWM signal according to a comparative result of said set value of said comparative reference value setting device and a count value of said PWM counter, and
an interruption output controller, wherein
said interruption output controller outputs an interruption signal indicating that it has reached an upper/lower limit value at a point where a count value of said PWM counter reaches a count upper/lower limit value in a set cycle of said carrier period, does not output an interruption signal at a point where said count value of said PWM counter reaches a count upper limit value in said set cycle of said double-speed period, outputs an interruption signal indicating that it has reached said count upper limit value at a point where said count value of said PWM counter reaches a count lower limit value for a first time in said set cycle of said double-speed period, and outputs an interruption signal indicating that it has reached said count lower limit value at a point where said count value of said PWM counter reaches said count lower limit value for a second time in said set cycle of said double-speed period.

* * * * *